(12) United States Patent
Lamvik et al.

(10) Patent No.: US 8,851,693 B2
(45) Date of Patent: Oct. 7, 2014

(54) STIMULATED LIGHTING DEVICES

(75) Inventors: Michael Kasper Lamvik, Durham, NC (US); James Lynn Davis, Holly Springs, NC (US)

(73) Assignee: Research Triangle Institute, Research Triangle Park, NC (US)

(*) Notice: Subject to any disclaimer, the term of this patent is extended or adjusted under 35 U.S.C. 154(b) by 337 days.

(21) Appl. No.: 13/258,212

(22) PCT Filed: Apr. 14, 2010

(86) PCT No.: PCT/US2010/031058
§ 371 (c)(1),
(2), (4) Date: Oct. 25, 2011

(87) PCT Pub. No.: WO2010/120900
PCT Pub. Date: Oct. 21, 2010

(65) Prior Publication Data
US 2012/0033403 A1    Feb. 9, 2012

Related U.S. Application Data

(60) Provisional application No. 61/169,468, filed on Apr. 15, 2009.

(51) Int. Cl.
| | |
|---|---|
| *F21V 9/16* | (2006.01) |
| *F21K 99/00* | (2010.01) |
| *G02B 19/00* | (2006.01) |
| *F21V 7/00* | (2006.01) |
| *F21V 13/02* | (2006.01) |
| *F21V 7/22* | (2006.01) |
| *F21Y 101/02* | (2006.01) |
| *H01L 33/50* | (2010.01) |
| *F21Y 113/00* | (2006.01) |

(52) U.S. Cl.
CPC ... *F21K 9/56* (2013.01); *F21K 9/00* (2013.01); *G02B 19/0028* (2013.01); *F21Y 2101/02* (2013.01); *G02B 19/0061* (2013.01); *H01L 33/502* (2013.01); *F21V 9/16* (2013.01); *F21V 7/0008* (2013.01); *F21V 13/02* (2013.01); *F21V 7/22* (2013.01); *H01L 33/505* (2013.01); *F21Y 2113/005* (2013.01)
USPC ............ 362/84; 362/231; 362/293; 362/301; 313/498; 313/506; 313/113

(58) Field of Classification Search
USPC ................. 313/498, 503, 506, 512, 113, 461; 362/2, 231, 298, 301, 84, 293
See application file for complete search history.

(56) References Cited

U.S. PATENT DOCUMENTS

| | | |
|---|---|---|
| 4,778,738 A | 10/1988 | Lipp et al. |
| 5,083,252 A | 1/1992 | McGuire |
| (Continued) | | |

OTHER PUBLICATIONS

U.S. Appl. No. 13/938,754, filed Jul. 10, 2013, Davis et al.

(Continued)

*Primary Examiner* — Anh Mai
*Assistant Examiner* — Kevin Quarterman
(74) *Attorney, Agent, or Firm* — Oblon, Spivak, McClelland, Maier & Neustadt, L.L.P.

(57) ABSTRACT

A stimulated lighting device for stimulatable light emission including a luminescent sheet including light stimulatable particles which emit secondary light upon receiving primary light. The lighting device includes a source configured to generate and direct the primary light obliquely onto the luminescent sheet, at least one reflector configured to reflect at least a part of the primary light and a part of the secondary light onto the luminescent sheet and configured to reflect at least a part of scattered primary light and a part of the secondary light from the luminescent sheet toward the light exit, and a light exit configured to emanate light as a combination of the primary light and the secondary light.

56 Claims, 29 Drawing Sheets

(56) References Cited

U.S. PATENT DOCUMENTS

| | | | |
|---|---|---|---|
| 5,324,202 A | 6/1994 | Meyers et al. | |
| 6,965,191 B2 | 11/2005 | Koike et al. | |
| 7,144,131 B2 | 12/2006 | Rains | |
| 7,592,277 B2 * | 9/2009 | Andrady et al. | 442/340 |
| 7,999,455 B2 * | 8/2011 | Davis et al. | 313/503 |
| 2007/0018361 A1 | 1/2007 | Xu | |
| 2008/0094829 A1 * | 4/2008 | Narendran et al. | 362/231 |
| 2008/0113214 A1 | 5/2008 | Davis et al. | |
| 2008/0170982 A1 * | 7/2008 | Zhang et al. | 423/447.3 |
| 2009/0123434 A1 * | 5/2009 | Ross | 424/93.7 |

OTHER PUBLICATIONS

International Search Report Issued Jun. 15, 2010 in PCT/US10/031058 filed Apr. 14, 2010.

U.S. Appl. No. 13/513,433, filed Jun. 1, 2012, Davis et al.

* cited by examiner

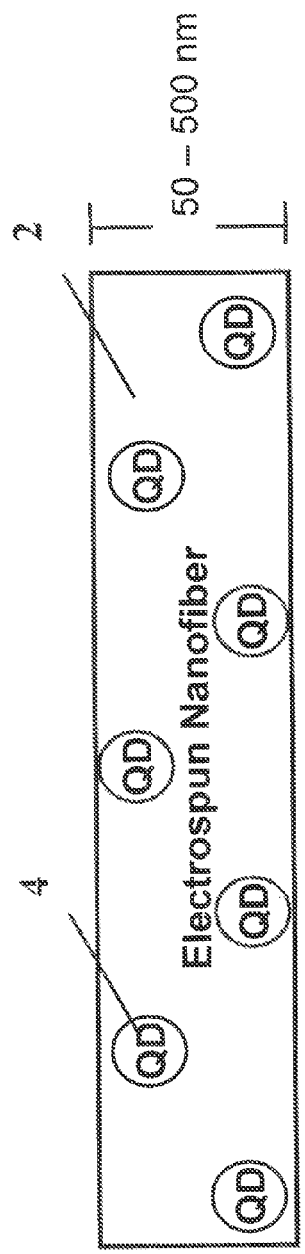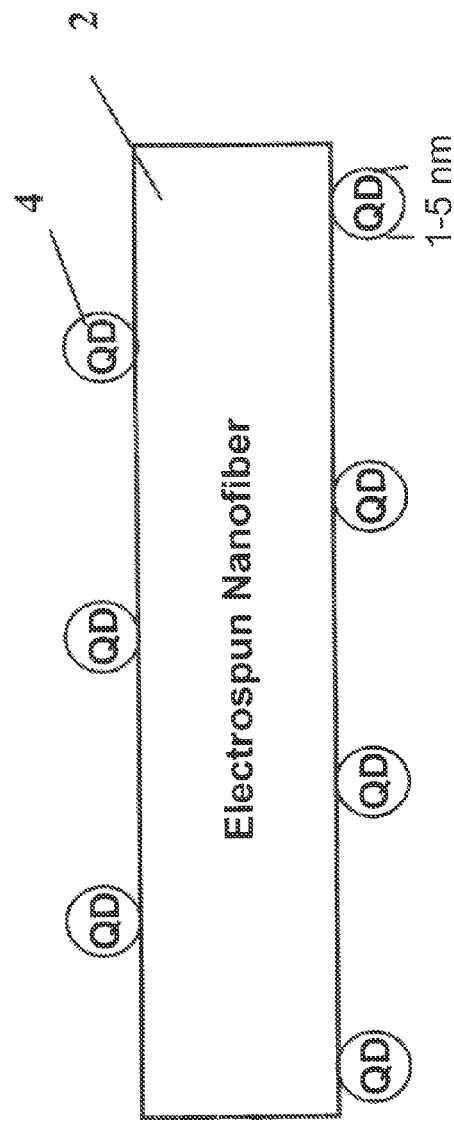

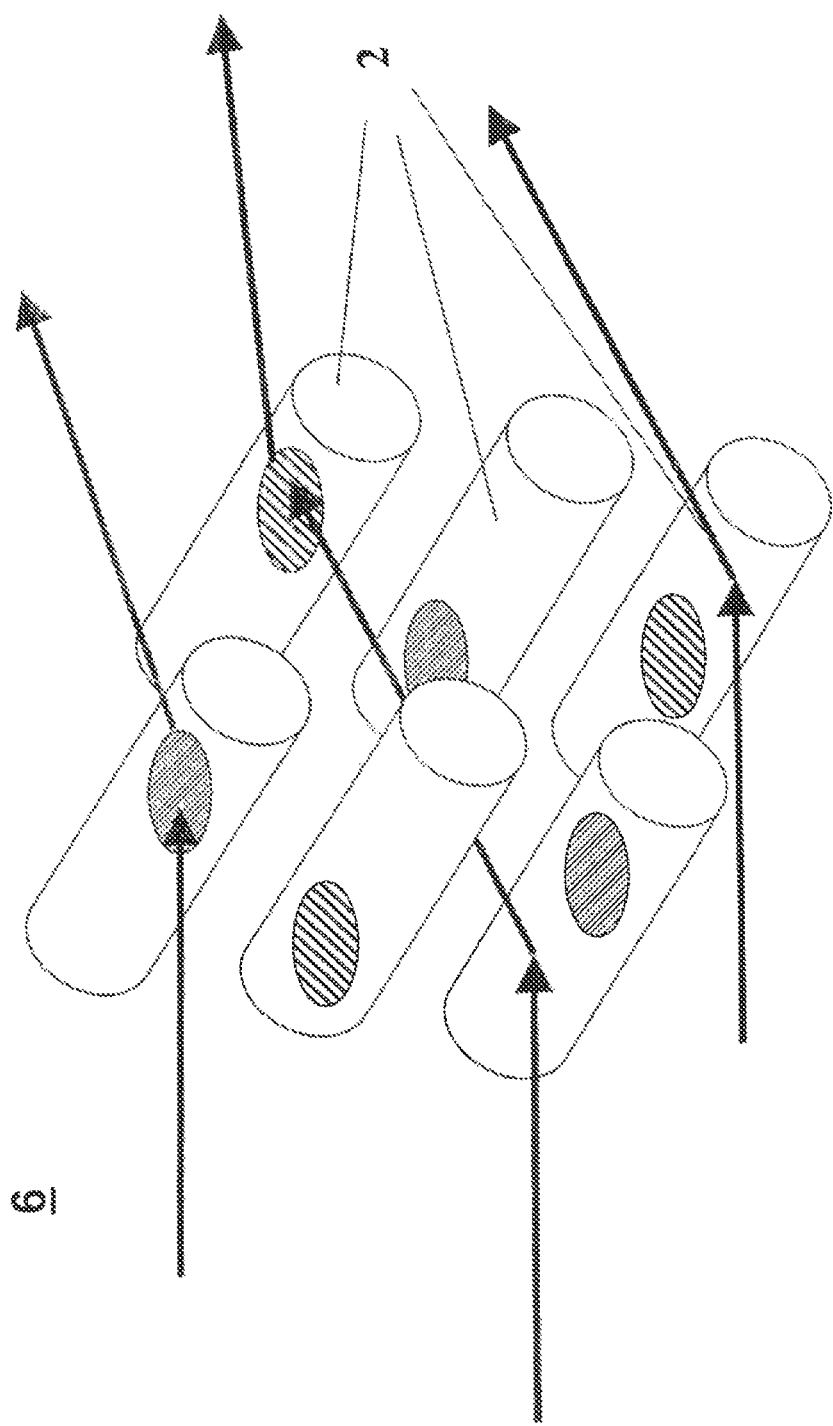

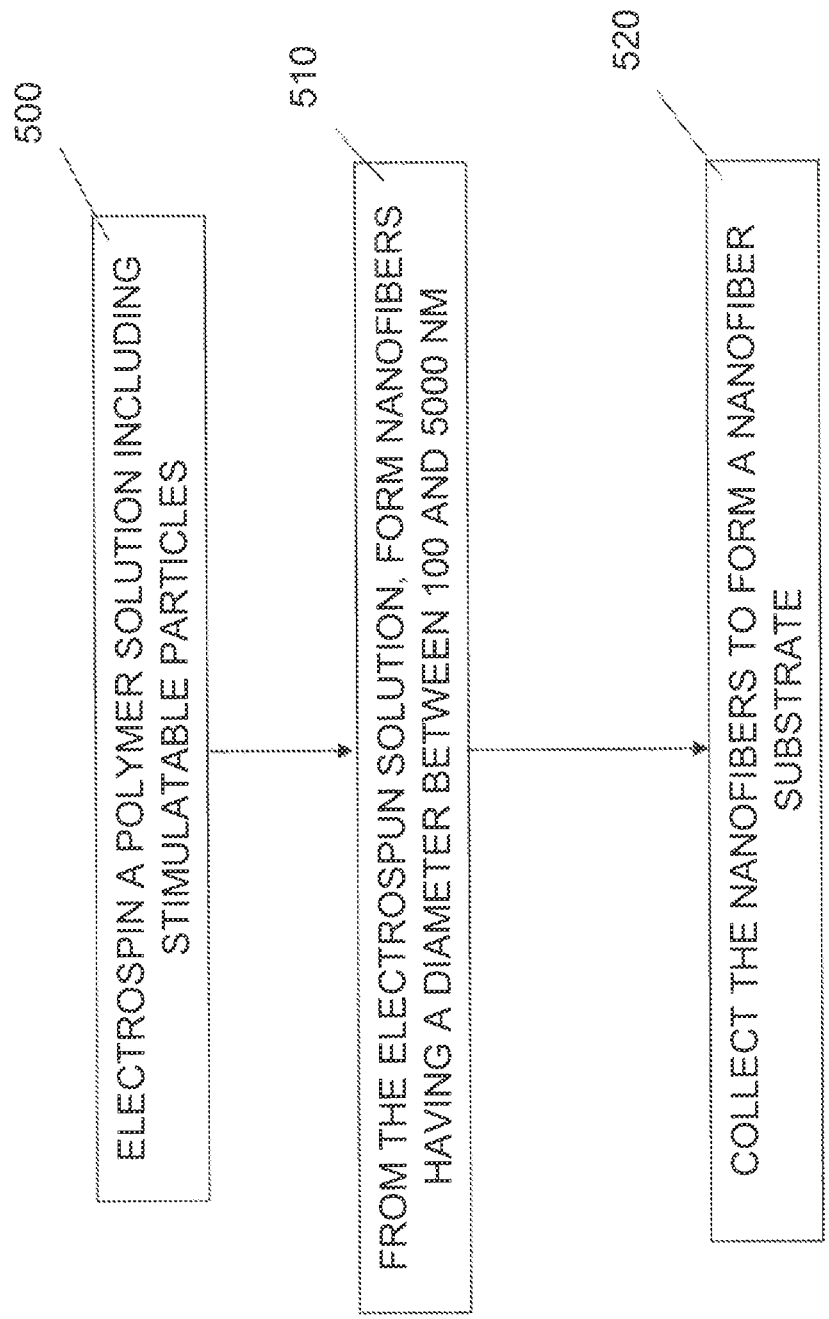

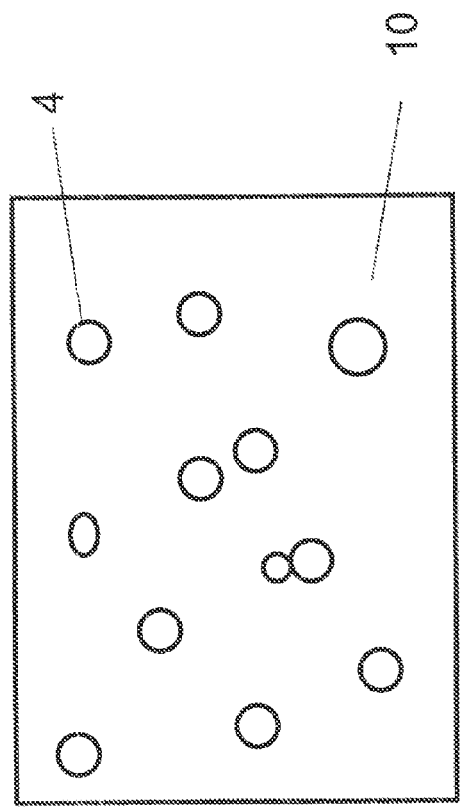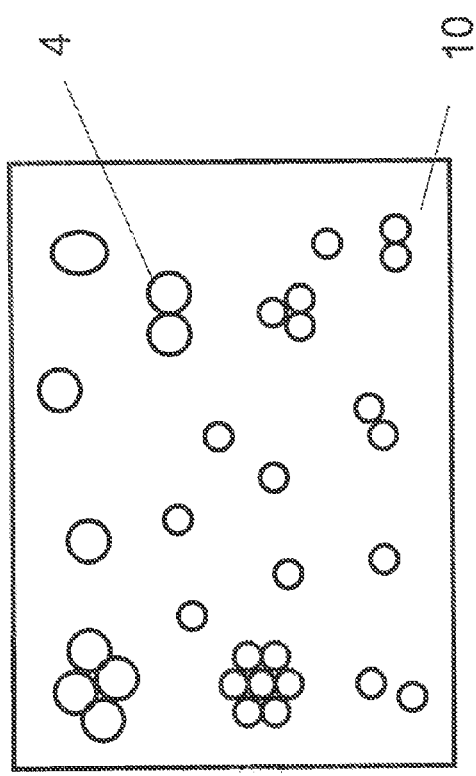

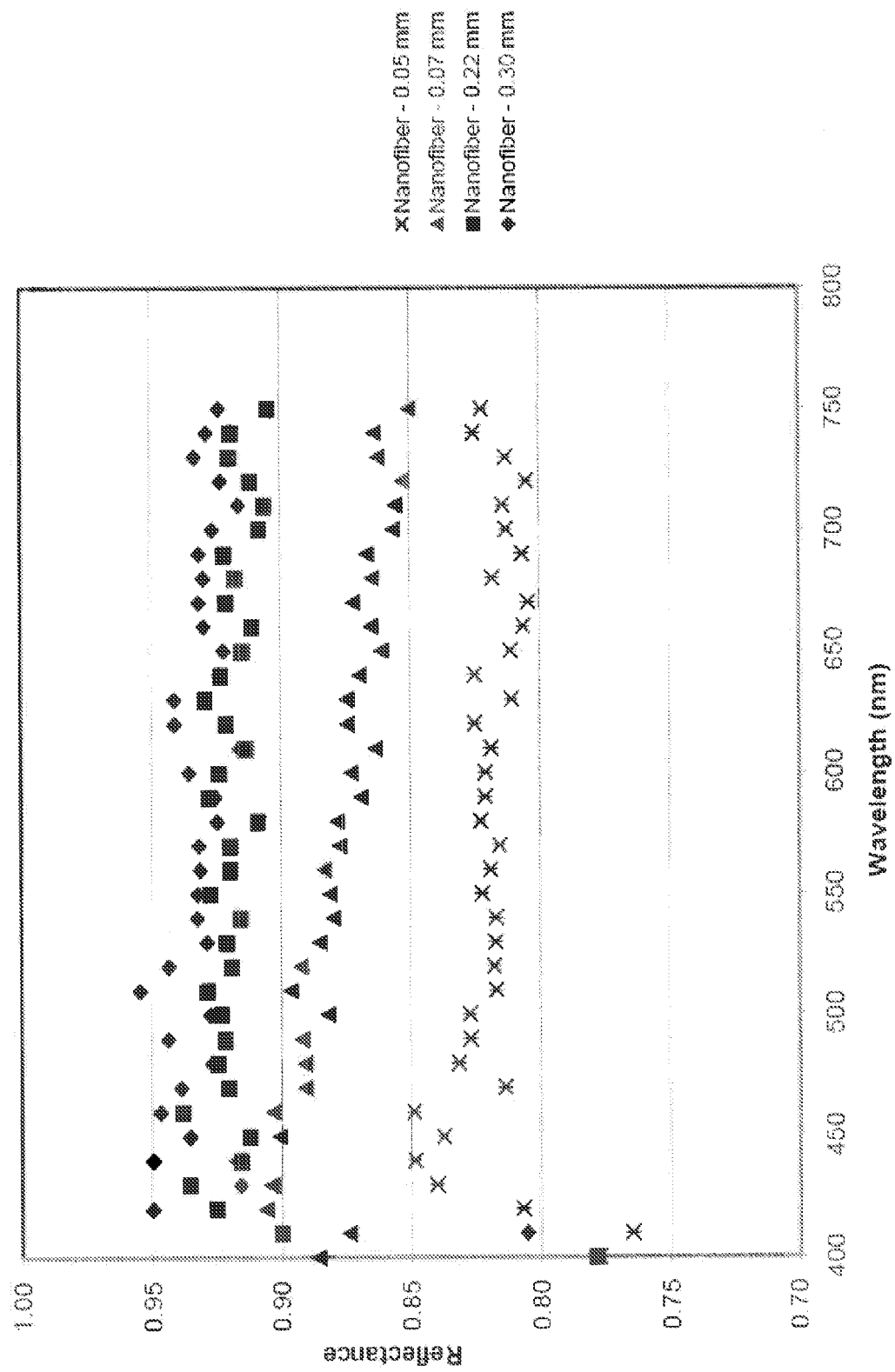

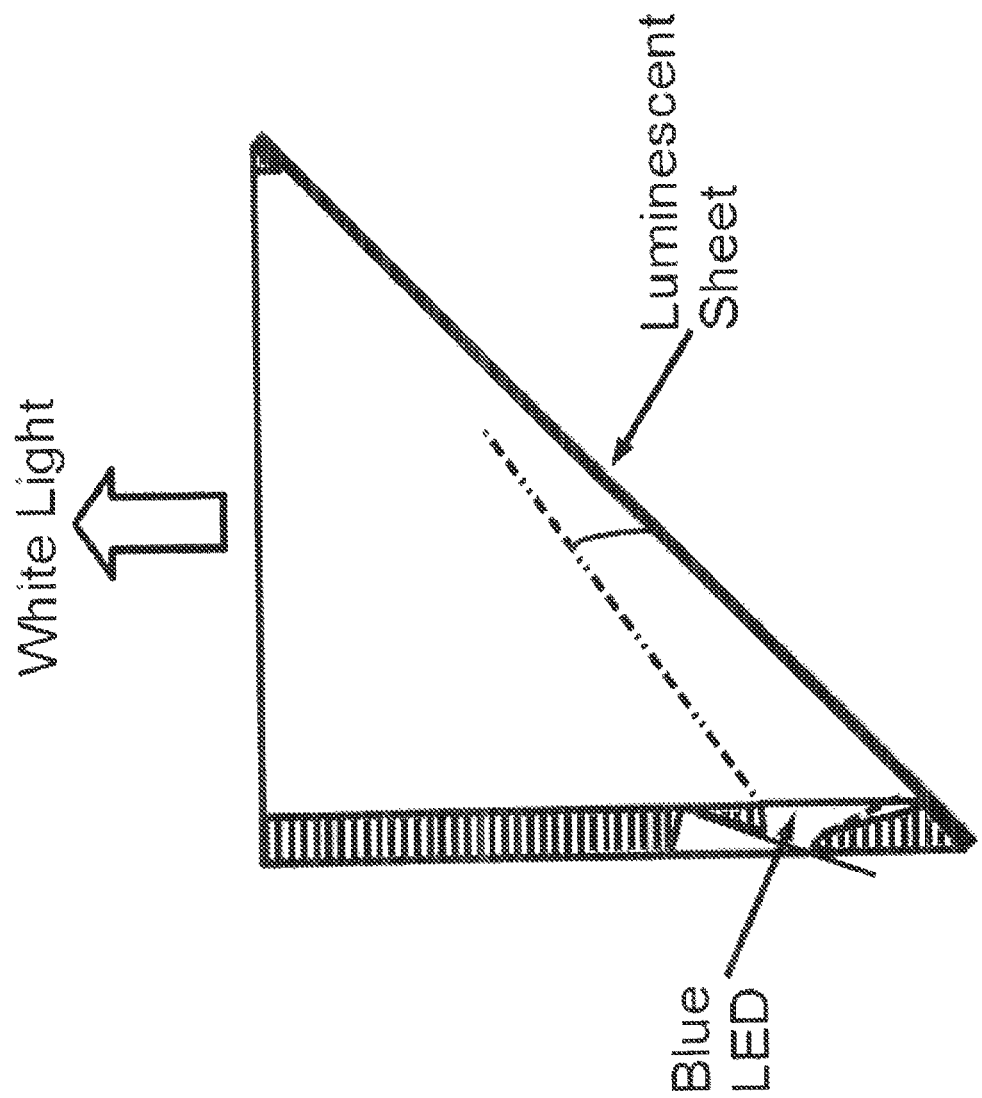

⟵——— = primary light

= primary light
= secondarily emitted light

⬅———— = primary light
⬅┄┄┄┄ = secondarily emitted light

STIMULATED LIGHTING DEVICES

CROSS REFERENCE TO RELATED APPLICATIONS

This application is related to and claims priority to U.S. Application Ser. No. 61/169,468, filed on Apr. 15, 2009, entitled "Stimulated Lighting Devices," the entire contents of which are incorporated herein by reference. This application is related to U.S. application Ser. No. 10/819,916, filed on Apr. 8, 2004, entitled "Electrospinning of Polymer Nanofibers Using a Rotating Spray Head," the entire contents of which are incorporated herein by reference. This application is also related to U.S. application Ser. No. 10/819,942, filed on Apr. 8, 2004, entitled "Electrospray/electrospinning Apparatus and Method," the entire contents of which are incorporated herein by reference. This application is related to U.S. application Ser. No. 10/819,945, filed Apr. 8, 2004, entitled "Electrospinning in a Controlled Gaseous Environment," the entire contents of which are incorporated herein by reference. This application is related to U.S. Ser. No. 11/130,269, filed May 17, 2005 entitled "Nanofiber Mats and Production Methods Thereof," the entire contents of which are incorporated herein by reference. This application is related to U.S. application Ser. No. 11/559,260, filed on Nov. 13, 2006, entitled "LUMINESCENT DEVICE," the entire contents of which are incorporated herein by reference. This application is related to U.S. Ser. No. 60/929,077, filed Jun. 12, 2007 entitled "Long-Pass Optical Filter Made from Nanofibers," the entire contents of which are incorporated herein by reference. This application is related to PCT/US2008/066620, filed Jun. 12, 2008 entitled "Long-Pass Optical Filter Made from Nanofibers," the entire contents of which are incorporated herein by reference.

BACKGROUND OF THE INVENTION

1. Field of the Invention

This is invention is related to device and apparatus and methods for producing white light from luminescent particle excitation and emission.

2. Description of the Related Art

The choice of general illumination sources for commercial and residential lighting is generally governed by a balance of energy efficiency and the ability to faithfully produce colors as measured by the color rendering index (CRI). Existing fluorescent lighting is known to be economical from an energy consumption point of view. However, many users complain that the light produced by the existing fluorescent lighting is of poor spectral quality and produces eye strain and other adverse health effects. Incandescent light is also widely used and is recognized as having excellent spectral quality and the ability to accurately render colors. This high spectral quality is derived from the hot filament, which approximates a blackbody radiator and emits light over many wavelengths, similar to the sun. However, incandescent lighting suffers from very low energy efficiency. Thus, there is a long felt need to produce light sources that use less energy and have a light composition similar to the composition of the sun light.

Solid-state lighting (SSL) is an alternative general illumination and lighting technology that promises the energy efficiency of fluorescent lights and the excellent spectral qualities of incandescent lighting. Typically, commercially available SSL lamps consists of a light emitting diode (LED) surrounded by a phosphor composed of large particles usually larger than 2 µm. The light emitted from the LED is of sufficient energy to cause the phosphor to fluoresce and emit one or more colors of visible light. The most common example of commercial SSL products consists of a blue LED (typically 460 nm) surrounded by a yellow phosphor, such as cerium-doped yttrium aluminum garnet (YAG:Ce), that emits lights in a broad band centered at 550 nm. The combination of nominally yellow light emission from the phosphor and blue light from the LED produces a light source that has a generally white appearance. Alternatively, an LED that emits in the ultraviolet (<400 nm) can be used to excite a blend of red, green, and blue phosphors. FIG. 1 is a schematic depiction of the spectrum of light obtained from a solid-state lighting device. While this approach produces white light, it suffers from low efficiency and poor spectral quality due to the limited number of wavelengths.

In addition, while the light intensity from lamps used in current solid-state lighting products is sufficient for applications such as flashlights, it is considered too low and the emission cone is considered too narrow for use in general illumination applications such as room lighting. Hence, there is a need for solid-state light sources that are capable of providing high intensity white light emissions over a large enough area for use in general illumination.

One approach proposed to improve the performance of SSL devices has been to use nanoparticles such as quantum dots as secondary converters to produce white light. "Quantum Dots Lend New Approach to Solid-State Lighting," Sandia National Laboratory press release Jul. 24, 2003. This approach incorporates quantum dots into a polymer used to encapsulate the light emitting diode (LED) and essentially creates a three-dimensional dome of quantum dots around the LED die. While this method has been successful in producing white light, the three-dimensional dome structure places large quantities of quantum dots in non-optimal positions around the LED and creates potential quantum dot agglomeration issues.

In general, SSL devices can be classified as either proximate or remote phosphor configurations depending upon the proximity of the phosphor and LED (see E. Fred Schubert, *Light-Emitting Diodes, Second Edition*, Cambridge University Press, 2006). In the proximate phosphor configuration, the phosphor and LED are contained in the same package and the phosphor often lies in intimate contact with the top surface of the LED. In the remote phosphor configuration, the phosphor and LED are physically separated to reduce the thermal efforts of the LED on the phosphor. The previous art described both proximate and remote phosphor configurations that suffer limitations overcome by the described invention. For example, U.S. Pat. No. 6,357,889 describes a color tunable light source utilizing a remote phosphor. This system requires at a minimum two different LEDs operating at two different wavelengths in order to produce white light. The increase complexity of this system results in increased costs. In another example, U.S. Pat. No. 7,144,131 describes an optical system consisting of a remote phosphor in which the phosphor is doped into a diffuse reflective material. Such a structure creates an optical system limited by the highly reflective properties of the host matrix, which requires that the entire structure contain phosphors, which increases costs. In another example, U.S. Patent Application 2009/0251884 describes an optical system consistent of a remote phosphor in which the phosphor is doped into a diffuse reflective material and the combined structure occupies the entirety of an optical integrating cavity. Such a structure also requires large amounts of phosphors increasing costs. Likewise, in such structures the luminescent material is integrated in a relatively permanent or complicated component that is expensive to replace, limiting the possibility of conveniently and inexpensively exchanging the carrier of the luminescent material for the purpose of maintenance or of allowing a variation of color.

Previously, polymer/quantum dot compound nanofibers have been obtained from electrospinning of the polymer/quantum dot composite solutions, as disclosed in Schlecht et. al., Chem. Mater. 2005, 17, 809-814. However, the nanofibers produced by Schlecht et al. were on the order of 10-20 nm in diameter, in order to produce quantum confinement effects. The size range of the nanoparticles and nanofibers disclosed therein is not advantageous for conversion of a primary light into secondary light emission across the white light spectrum.

Lu. et. al., Nanotechnology, 2005, 16, 2233, also reported the making of $Ag_2S$ nanoparticles embedded in polymer fiber matrices by electrospinning. Once again, the size range of the nanoparticles and nanofibers shown therein is not advantageous for conversion of a primary light into secondary light emission across the white light spectrum.

As described in U.S. application Ser. No. 11/559,260, filed on Nov. 13, 2006, entitled "LUMINESCENT DEVICE," referenced above, highly-efficient, light-producing sheets have been developed based on a combination of photoluminescent particles and polymer nanofibers. These luminescent sheets can be used in a white-light solid-state lighting device in which the sheets are illuminated by a blue light-emitting diode (LED) light source and the sheets will transform the incident blue light into, for example, yellow light. An appropriate mixture of yellow and blue light will produce the appearance of white light.

One particular advantage of these light-producing sheets is that photoluminescent particles are suspended above the nanofibers instead of being contained in a bulk material with a relatively high index of refraction. This arrangement prevents light from being trapped by total internal reflection, as occurs when the nanoparticles are encapsulated within bulk materials.

SUMMARY OF THE INVENTION

In one embodiment of the present invention, there is provided a stimulated lighting device for stimulatable light emission. The lighting device includes a luminescent sheet including light stimulatable particles which emit secondary light upon receiving primary light. The lighting device includes a source configured to generate the primary light, at least one reflector configured to reflect at least a part of the primary light and a part of the secondary light onto the luminescent sheet and configured to reflect at least a part of scattered primary light and a part of the secondary light from the luminescent sheet toward the light exit, and a light exit configured to emanate light as a combination of the primary light and the secondary light.

In another embodiment of the present invention, there is provided a stimulated lighting device including a reflective housing and a luminescent sheet disposed in the reflective housing and configured to emit secondary light upon receiving primary light. The device includes a source configured to generate the primary light and a light exit in the reflective housing configured to emanate light from the reflective housing as a combination of the primary light and the secondary light.

It is to be understood that both the foregoing general description of the invention and the following detailed description are exemplary, but are not restrictive of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is schematic depicting the disposition of luminescent compounds inside a volume of a fiber, according to one embodiment of the present invention;

FIG. 2B is schematic depicting the disposition of luminescent compounds on or near the surface of a fiber, according to one embodiment of the present invention;

FIG. 3 is schematic depicting a fiber substrate, according to one embodiment of the present invention, in which the fibers serve as individual scattering centers;

FIG. 5 is a flow chart illustrating a method for forming a luminescent device according to an embodiment of the present invention in which luminescent particles are included in an electrospray polymer;

FIG. 6A is a schematic of a quantum dot dispersion in a polymer matrix at a concentration where agglomeration is present only at a low concentration;

FIG. 6B is a schematic of a quantum dot dispersion in a polymer matrix at a concentration where agglomeration is a factor;

FIG. 13B is a depiction of the measured reflectance across the visible spectrum of nanofiber substrates of varying thicknesses.

FIG. 13E is a depiction of another lighting structure according to one embodiment of the present invention.

DETAILED DESCRIPTION OF THE EMBODIMENTS

Figure 1:
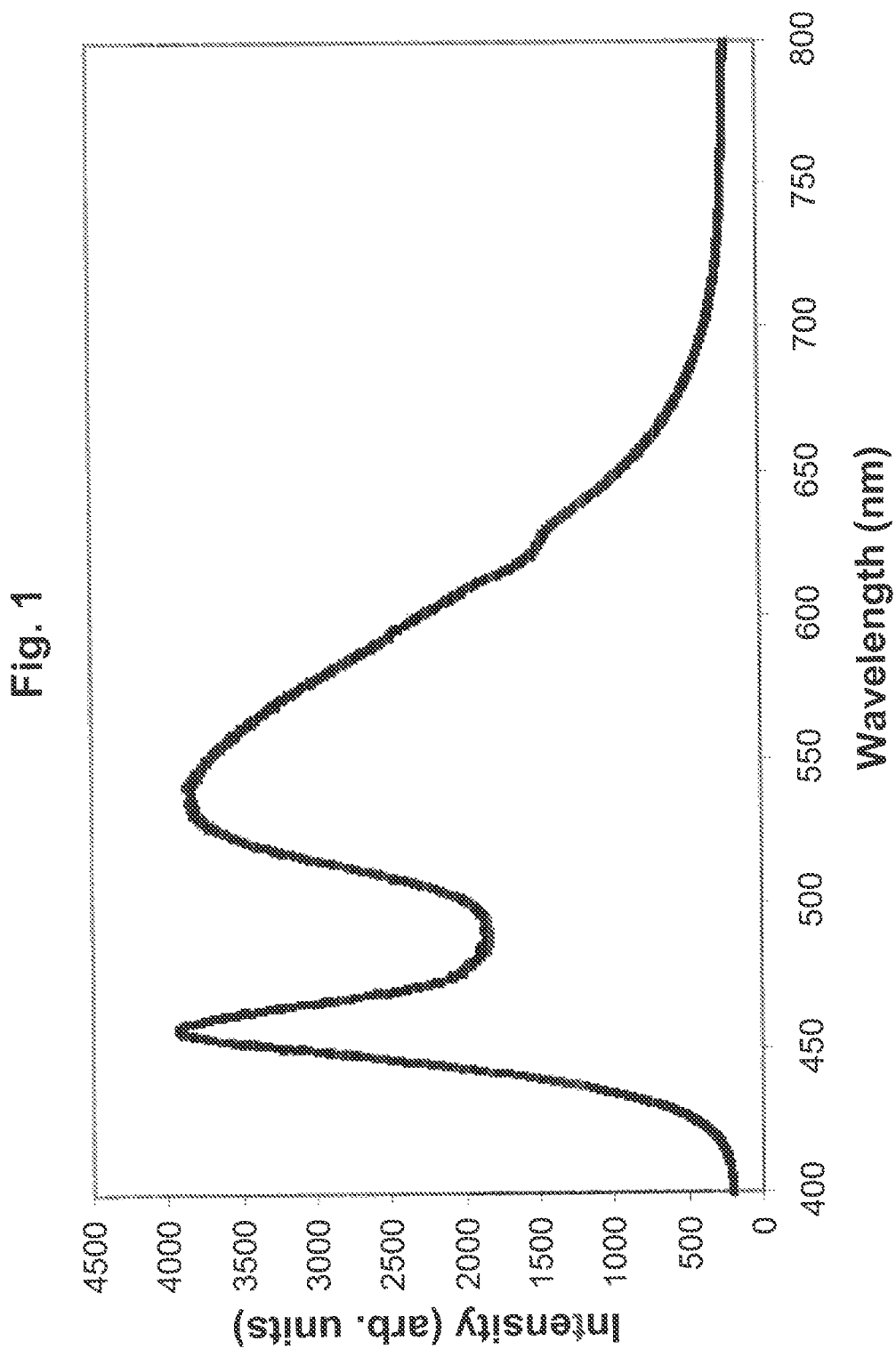
FIG. 1 is a schematic depiction of the spectrum of light obtained from a conventional solid-state lighting device.

Lighting devices for general illumination can be fabricated by combining a pump wavelength (e.g., blue emission in the 440-470 nm range; violet emission in the 380-440 nm range; or ultraviolet emission in the 330-380 nm range) with one or more photoluminescent materials that emit at wavelengths longer than the pump light. The photoluminescent material may be of multiple chemistries and particle sizes including phosphors, nanophosphors, and quantum dots. The luminescent material is often brittle and requires a binder or support matrix in order to be incorporated into practical devices.

In one embodiment of the present invention, a lighting device includes luminescent particles combined with a polymeric material that provides mechanical strength and imparts desirable optical properties to the resulting photoluminescent layer. For example, it is desirable in some lighting applications to have a photoluminescent layer that includes a blend of light transmission and light reflection properties, which can be achieved through the judicious choice of materials for the composite. Alternatively, in some embodiments of the present invention, it is desirable to have a photoluminescent layer that provides a high degree of light reflection. This can also be achieved (as described below) through appropriate choice of materials for the composite and the methods used to fabricate them.

One way to control the transmission and reflection properties of the photoluminescent layer is by controlling the index of refraction of the photoluminescent layer. For example, a photoluminescent layer that is index matched with its surrounding medium will display a large light transmission, while a material that is not index matching will display a mixture of light transmission and light reflection. The extent of light reflection in such a media is determined by the difference in the index of refraction of the photoluminescence layer to the surrounding media through the Fresnel equations.

One alternative way to control the transmission and reflection properties of the photoluminescent layer is to introduce features with dimensions on the order of the wavelength of light. Such features, typically 100 nm to 800 nm in size, will promote scattering of the light beam, which increases the reflection coefficient. The features may be of a different refractive index than their surroundings which will impart transmission and reflection properties governed by the Fresnel equations. Examples of materials which can be incorporated into the photoluminescent layer include such materials as polymeric nanofibers, natural and synthetic papers such as PolyArt®, and etched glasses and plastics.

Light scattering occurring in the photoluminescent layer may also be used to increase the ability of the material to diffuse light or spread its intensity over a larger area. In the extreme, light scattering can be used to produce a Lambertian scatterer in which the intensity of the object appears the same regardless of the viewing angle.

The photoluminescent layer can be created in one embodiment by adding a range of photoluminescent materials to a polymeric or ceramic material that imparts the ability to control the transmission and reflection of light. Such photoluminescent materials include phosphors, nanophosphors, and quantum dots.

Phosphors are a general class of materials that emit radiation when exposed to radiation of a different wavelength. In one embodiment of the present invention, such phosphors are generally exposed to either a blue, violet, or ultraviolet light source (i.e., pump) and will absorb photons from the incident light source creating an excited electronic state. This excited state can emit a photon at a wavelength that is generally longer than the pump wavelength through the process of fluorescence or more specifically photoluminescence. Phosphors are generally made from a suitable host material (e.g., aluminum garnet, metal oxides, metal nitrides, and metal sulfides) to which an activator (e.g., copper, silver, europium, cerium and other rare earths) is added. Typically, the phosphor particle size is often 1 µm or larger. Recently, phosphors have been developed that are characterized by particles sizes below 100 nm. These nanophosphors often have similar chemistries as larger particle sizes but scatter light to a lesser degree due to their small size.

Particles having a size less than 50 nm often can be classified as quantum dots. Quantum dots are nanoparticles whose dimensions have an order of magnitude equivalent to or smaller than the size of an electron at room temperature (deBroglie wavelength). When the size of the quantum dot is roughly the same or smaller than the deBroglie wavelength of an electron, then a potential well is created that artificially confines the electron. The size of this potential well determines the quantized energy levels available to the electron, as described in the "particle-in-a-box" solution of basic quantum mechanics. Since the energy levels determine the fluorescent wavelengths of the quantum dot, merely changing the size of the quantum dot changes, to a first approximation, the color at which the quantum dot radiates visible light. Thus, the quantum confinement effects of the quantum dots directly influence the light emitted from the respective quantum dot, and a broad spectrum of colors may be achieved by assembling quantum dots of different sizes.

A typical quantum dot includes a nanocrystalline core that may be surrounded by a shell of an inorganic material with a higher band gap. This structure is capped with an external organic layer that ensures compatibility with various solvents. In this context, the entire assembly (i.e., nanocrystalline core, shell of higher band gap material, and organic capping layer) is referred to collectively as a quantum dot. A representative example of such quantum dots includes a cadmium selenide nanocrystalline core surrounded by a zinc sulfide shell and capped with organic ligands such as trioctylphosphine oxide or a long-chain amine such as hexadecylamine. Such core shell structures are sold by Evident Technologies of Troy, N.Y.

The nanocrystalline core of quantum dots may be fabricated from a variety of materials including but not limited to at least one of silicon, germanium, indium gallium phosphide, indium phosphide, cadmium sulfide, cadmium selenide, lead sulfide, copper oxide, copper selenide, gallium phosphide, mercury sulfide, mercury selenide, zirconium oxide, zinc oxide, zinc sulfide, zinc selenide, zinc silicate, titanium sulfide, titanium oxide, and tin oxide, etc. Of particular utility to the present invention are quantum dots having a core of at least one of CdSe, InGaP, InP, GaP, and ZnSe. The optical properties of quantum dots are produced by this nanocrystalline core.

Quantum dots are commercially available as colloidal dispersions in low dielectric constant (low-K) organic solvents such as toluene. However, quantum dots experience mutual attraction and can agglomerate, which may disrupt their quantum behavior and change their performance characteristics. For example, agglomeration is known to reduce the light emission efficiency of quantum dots and is known to cause red-shifts in emission frequency due to energy transfer to larger dots formed as a result of agglomeration. See J. Rodriguez-Viejo, K. F. Jensen, H. Mattoussi, J. Michel, B. O. Dabbousi and M. G. Bawendi, *Applied Physics Letters*, vol. 70 (1997), no. 16, page 2132, the entire contents of which are incorporated herein by reference. Due to the sensitivity of the human eye to slight color variations, particle agglomeration can have a significant impact on the quality of light from an illumination source. In the extreme, agglomeration can lead to quenching of photoluminescence from quantum dots.

Nanofibers are a solid structure that has one dimension (diameter) in the 10-2000 nm range, and the other dimension (length) can be quite long in the meters range. Nanofibers suitable for the present invention can be made from a variety of materials, including polymers, ceramics, and glasses, sol gels, and blends of materials can also be readily fabricated. One feature of nanofibers is their small diameter and consequently high surface area. Nanofiber diameters on the order of visible light (~500 nm) or even smaller can be readily produced creating very large surface areas.

Figure 2C:
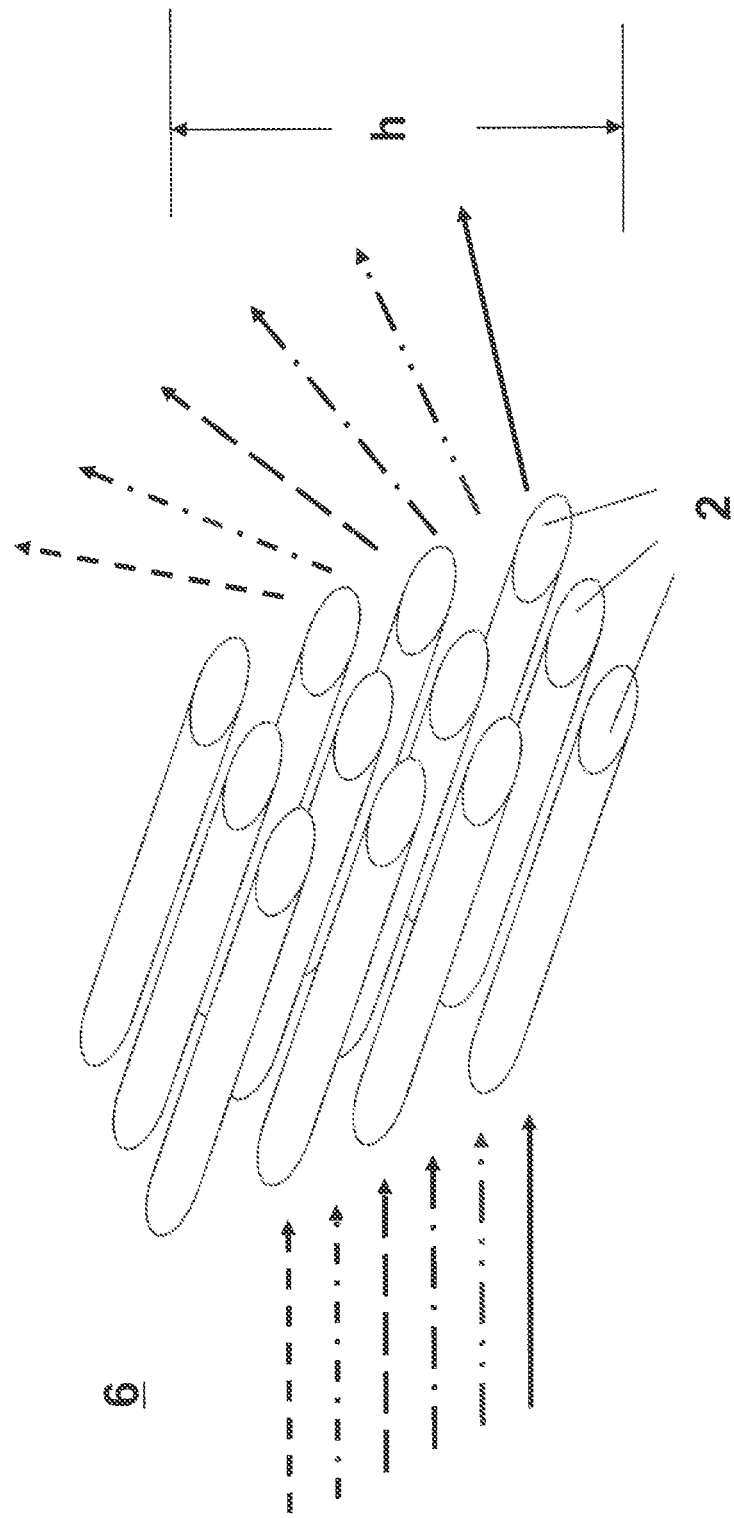
FIG. 2C is schematic depicting a fiber substrate, according to one embodiment of the present invention, in which the fiber substrate in total serves as an optical scattering center.

Referring now to the drawings, wherein like reference numerals designate identical or corresponding parts throughout the several views, in various embodiments of the present invention, FIGS. 2A and 2B are schematics depicting light stimulatable fibers (LF) 2 including for example a luminescent particle 4 (i.e., one of the compounds disclosed below) disposed either on the surface or in the bulk of the nanofiber. More specifically, FIG. 2A is schematic depicting the disposition of luminescent particles 4 (e.g., light stimulatable particles such as quantum dot semiconductor materials, phosphors, or nano-phosphors) inside a volume of a fiber 2, which in FIG. 2A is depicted as a nanofiber. FIG. 2B is schematic depicting the disposition of luminescent particles 4 on or near the surface of a fiber 2, which in FIG. 2B is also depicted as a nanofiber. FIG. 2C is schematic depicting a fiber substrate 6, according to one embodiment of the present invention, in which the fiber substrate 6 in total serves as an optical scattering center. In this configuration, according to one embodiment of the present invention, stimulatable particles (while not explicitly shown) are disposed in association with the nanofibers 2 throughout the fiber substrate thickness h. The nanofibers 2 cumulatively provide scattering sites for excitation (or primary) light, thereby in one embodiment of the present invention enhancing the probability of interaction between the pump source light and the stimulatable particles 4.

FIG. 3 is schematic depicting a fiber substrate 6, according to one embodiment of the present invention, in which the fibers 2 are shown as individual scattering centers. The nanofibers 2 individually provide scattering sites for excitation (or primary) light, thereby in one embodiment of the present invention enhancing the probability of interaction between the pump source light and the stimulatable particles 4.

Hence, in various embodiments of the present invention to be explained in greater detail below, there is provided a device including the fiber substrate shown for example in FIGS. 2C and 3 for stimulatable emission from a fiber substrate. The fiber substrate 6 includes nanofibers having an average fiber diameter in a range between 100 and 2000 nm, and plural light stimulatable particles disposed in association with the nanofibers. The stimulatable particles 4 can produce secondary light emission upon receiving primary light at a wavelength $\lambda$. The average fiber diameter is comparable in size to the wavelength $\lambda$ in order to provide scattering sites within the fiber substrate for the primary light.

As discussed later in greater detail, the average fiber diameter is in a range between 100 to 5000 nm, or more suitably between 300 nm to 2000 nm, or more suitably between 400 nm to 1000 nm. The wavelength $\lambda$ is in a range between 100 and 2000 nanometers, or more suitably between 400 and 500 nanometers. The fiber substrate 6 has a thickness in a range between 0.1 and 2,000 microns, or more suitably in a range between 1 to 500 microns.

In various embodiments of the present invention, the stimulatable particles 4 include for example besides or in addition to the quantum dot materials listed above phosphors, including nano-phosphors. Phosphors such as for example in the list below and others are suitable for the present invention. Examples of suitable phosphors include, but are not limited to:

1. Rare-Earth doped metal oxide such as $Y_2O_3$:Tb, $Y_2O_3$:$Eu^{3+}$, $Lu_2O_3$:$Eu^{3+}$, $CaTiO_3$:$Pr^{3+}$, $CaO$:$Er^{3+}$, $(GdZn)O$:$Eu^{3+}$; $Sr_4Al_{14}O_{25}$:$Eu^{3+}$, $GdMgB_3O_{10}$:$Ce^{3+}$:$Tb^{3+}$, $CeMgAl_{11}O_{19}$:$Ce^{3+}$:$Tb^{3+}$, $Y_2O_3$:$Eu^{3+}$;
2. Metal sulfides such as $CaS$:$Eu^{2+}$, $SrGa_2S_4$:Eu and $Ca_{w-}Sr_xGa_y(S,Se)_z$:Eu
3. Rare-Earth doped yttrium aluminum garnet (YAG) such as YAG:$Ce^{3+}$;
4. Metal silicates including $Ca_3(Sc,Mg)_2Si_3O_{12}$:Ce and $(Ba,Sr)_2SiO_4$:Eu;
5. Rare-Earth doped zirconium oxide such as $ZrO_2$:$Sm^{3+}$, $ZrO_2$:$Er^{3+}$;
6. Rare-Earth doped vanadate ($YVO_4$:Eu) and phosphate (La, Ce,Tb)$PO_4$;
7. Doped materials consisting of a host matrix (e.g., $Gd_2O_3$, $GdO_2S$, PbO, ZnO, ZnS, ZnSe) and a dopant (Eu, Tb, Tm, Cu, Al and Mn); and
8. Metal-doped forms of zinc sulfide and zinc selenide (e.g., ZnS:$Mn^{2+}$, ZnS:$Cu^+$, $Zn_{0.25}Cd_{0.75}S$:AgCl).

Other examples of phosphors for use with this invention may be found in W.M. Yen, S. Shionoya, and H. Yamamoto, *Phos-*

*phor Handbook*, Second Edition, the entire contents of which are incorporated here by reference. Of particular utility to the present invention are phosphors including at least one of rare-Earth doped YAG, doped metal sulfides including doped ZnS and doped SrGa$_2$S$_4$, and doped ZnSe.

Further, as discussed in more detail later, the stimulatable particles 4 can include a plurality of color-distinctive light emitters (i.e., a distribution of different sized quantum dots or a distribution of phosphors) which produce respective secondary light emissions from the primary light and thereby form a resultant white light having a color rendering index greater than 70, or greater than 80.

In one embodiment of the present invention, by dispersing the stimulatable particles 4 on a high surface area medium such as for example a fiber substrate of nanofibers, the emission efficiency of a fiber substrate 6 containing the nanofibers 2 and the stimulatable particles 4 (e.g., the quantum dots or phosphor) is increased above that achieved with planar packing of the luminescent particles are dispersed in a film. As a result, in one embodiment of the present invention, such a nanofiber substrate structure can capture, with a higher efficiency than if the quantum dots were dispersed in a film, photons emitted by an LED and re-radiate at visible wavelengths with higher intensities than would be possible with planar packed luminescent particles.

While not limited to any particular theory, light scattered from the fibers 2 depends on the fiber diameter, spacing between adjacent fibers, light wavelength, orientation of the fiber to the light and the refractive index of the fibers. Polymers of the fibers have real refractive indices in the range between 1.3 to 1.6. Examples of the light scattering efficiency curves for long fibers of slightly absorbing materials (and which may act in a similar manner as the nanofiber structures of the present invention) have been detailed previously by Van de Hulst, in Light Scattering by Small particles, Dover, 1957. In that earlier work, for an incident light of 300 nm, the maximum light scattering has a size parameter ($\pi$ times fiber diameter/wavelength) of 3.14 and a scattering efficiency (Q) of $Q_1$=4.2. For incident light at 600 nm, the size parameter is 1.6 and $Q_1$=2. Therefore, the shorter wavelength light (expected to be used frequently in the present invention) is twice more likely of being trapped in the substrate of fibers than the longer wavelength light. An alternative explanation of this phenomenon is that, on average, the optical path length (OPL) of light at 400 nm through an appropriately designed nanofiber material is longer than the OPL of 600 nm light. The implications of this phenomenon as applied to the present invention are that an enhancement of light emission may be obtained from the light scattering characteristics of the fibers in the fiber substrate (i.e., each fiber acting as a scattering center, and the substrate of fibers acting as a medium to more effectively confine the excitation light in the fiber substrate medium permitting a higher probability that the excitation light would interact with a light emitter during its residence in the fiber substrate.

For example, in the present invention a typical excitation wavelength is blue light at 450 nm. In order to produce white light, the structure will need to emit radiation over a broad range of frequencies from 450 nm to 700 nm. By fabricating a nanofiber structure in which the average diameter of the nanofibers 4 in the substrate 6 is roughly the same as that of the excitation source (i.e., 450 nm), the excitation frequency can be effectively trapped in the nanofiber structure by light scattering (i.e., OPL of the excitation source is long). This increases the likelihood that the excitation source will initiate fluorescence and produce white light. In contrast, the longer wavelength emissions produced by fluorescence of the luminescent compound will be scattered less effectively by the nanofibers in the fiber substrate, and are more likely to emerge from the fiber substrate structure with minimal scattering. Under these conditions, the light scattering/photonic properties as a function of wavelength and fiber diameter are improved.

In one embodiment of the present invention, the fiber substrate 6 includes a number of nanofibers layers (as shown in FIG. 2C). The nanofibers 2 of these layers serve individually as scattering centers for the incident excitation light. Typically, the nanofibers have an average diameter that is approximately that of the wavelength of the excitation source (i.e., from 100-1000 nm). Furthermore, the number of layers in the fiber may typically form a thickness for the fiber substrate 6 in a range of 0.1 to 2,000 microns, although thinner values such as for example 0.01 microns and thicker values such as for example 3,000 microns are suitable. The thinner layers may not be as likely to "capture" the incident excitation light, and the thicker layers may substantially scatter the induced light from the quantum dots. As a result, thinner layers have a higher transmittance at certain wavelengths, while thicker layers will have greater reflectance. In the limit, the nanofiber structure will exhibit high (i.e., >0.80) reflectance values as shown in FIG. 24.

Fabrication Procedures

Formation of the light stimulatable structures in the present invention can occur through a number of methods. The formation methods typically involve the formation of nanofibers 2 of a controlled diameter and the application of the stimulatable particles 4 (e.g., quantum dots or phosphors) to the nanofibers 2. In one method, stimulatable particles 4 can be applied to the electrospun fibers as the fibers are coalescing into a resultant fiber substrate. In one method, stimulatable particles 4 can be included in the electrospray medium. In one method, stimulatable particles 4 can be applied to the resultant fiber substrate after the substrate has been formed without any stimulatable particles.

Figure 4:
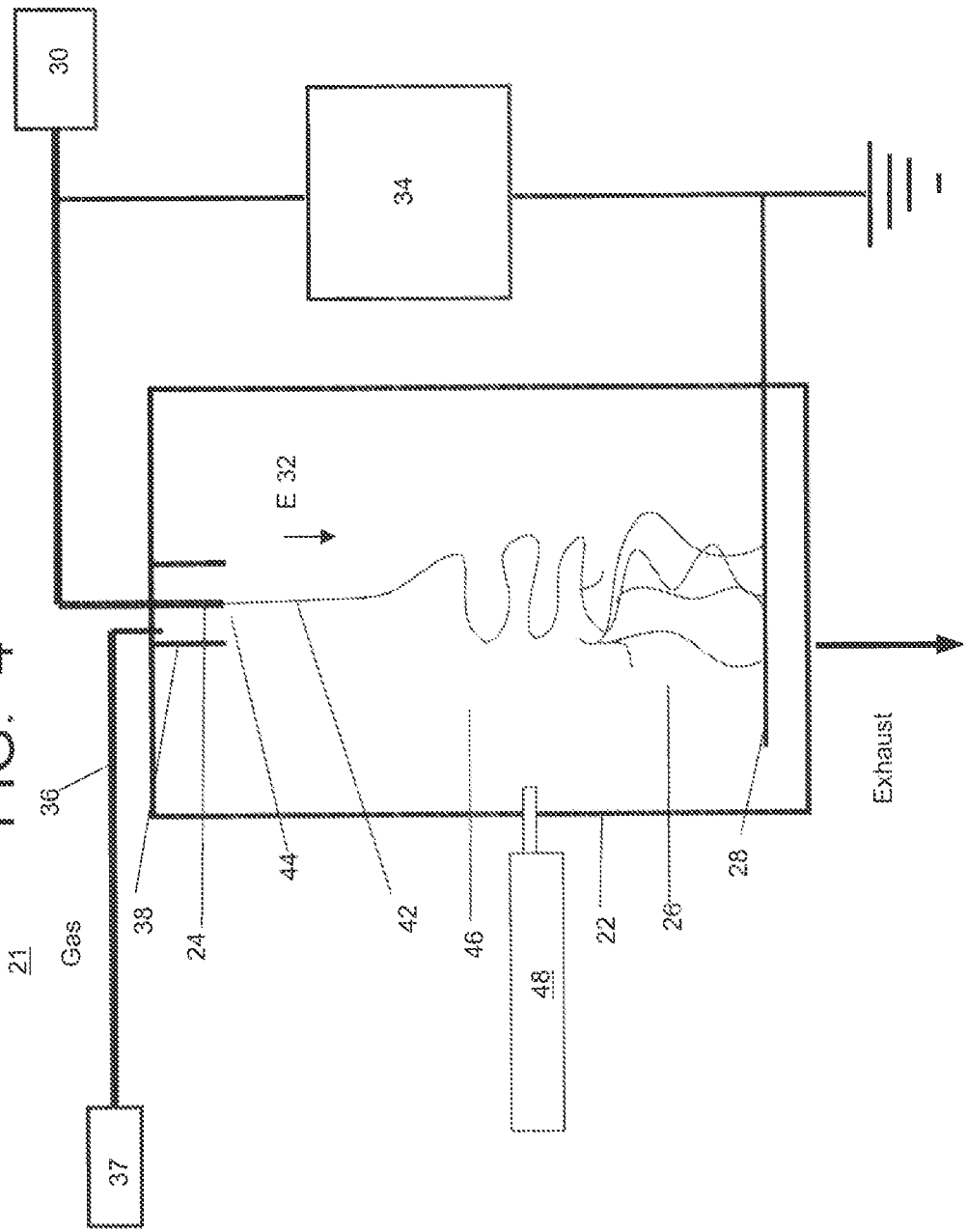
FIG. 4 is a schematic illustration depicting an electrospinning apparatus suitable for deposition of fibers and/or nanofibers of the present invention including nanoparticle light emitters.

FIG. 4 is a schematic illustration depicting an electrospinning apparatus suitable for deposition of fibers and/or nanofibers of the present invention, including the deposition of fibers and/or nanofibers having stimulatable particles 4 including nanoparticle light emitters such as the above-noted quantum dots and nano-phosphors. In one embodiment of the present invention, the stimulatable particles 4 incorporated into the fibers and/or nanofibers of the present invention are smaller than the diameter of the fibers. In one embodiment of the present invention, the stimulatable particles 4 incorporated into the fibers and/or nanofibers of the present invention are larger than the diameter of the fibers.

In FIG. 4, an electrospinning apparatus 21 includes a chamber 22 surrounding an electrospinning element 24. As such, the electrospinning element 24 is configured to electrospin a substance from which fibers are composed to form fibers 26. The electrospinning apparatus 21 includes a collector 28 disposed from the electrospinning element 24 and configured to collect the fibers and/or nanofibers. Various methods for forming fibers and nanofibers are described in U.S. Ser. Nos. 10/819,942, 10/819,945, and 10/819,916 listed and incorporated by reference above.

The electrospinning element 24 communicates with a reservoir supply 30 containing the electrospray medium such as for example the above-noted polymer solution. The electrospray medium of the present invention includes polymer solutions and/or melts known in the art for the extrusion of fibers including extrusions of nanofiber materials. Indeed, polymers and solvents suitable for the present invention include for example polystyrene in dimethylformamide or toluene, polycaprolactone in dimethylformamide/methylene chloride mixture, poly(ethyleneoxide) in distilled water, poly(acrylic acid) in distilled water, poly(methyl methacrylate) PMMA in acetone, PMMA in dimethyl formamide (DMF), PMMA in N-methyl formamide (NMF), cellulose acetate in acetone, polyacrylonitrile in dimethylformamide, polylactide in dichloromethane or dimethylformamide, and poly(vinylalcohol) in distilled water and combinations thereof. In general, suitable solvents for the present invention include both organic and inorganic solvents in which polymers can be dissolved. The polymer materials when formed are preferably optically non-absorbing materials, although the polymers may be spun with additives that act as color filters for the luminescent compounds (as discussed in more detail later).

A high voltage source 34 is provided to maintain the electrospinning element 24 at a high voltage. The collector 28 is placed preferably 1 to 100 cm away from the tip of the electrospinning element 24. The collector 28 can be a plate or a screen. Typically, an electric field strength between 2,000 and 400,000 V/m is established by the high voltage source 34. Typically, the collector 28 is grounded, and the fibers 26 produced by electrospinning from the electrospinning elements 24 are directed by the electric field 32 toward the collector 28. The electric field 32 pulls the substance from which the fiber is to be composed as a filament or liquid jet 42 of fluid from the tip of the electrospinning element 24. A supply of the substance to each electrospinning element 24 is preferably balanced with the electric field strength responsible for extracting the substance from which the fibers are to be composed so that a droplet shape exiting the electrospinning element 24 is maintained constant. In the polymer solutions (or alternatively introduced onto the fibers after or during the electrospinning process) are luminescent compounds. The fibers deposited in the one embodiment of the present invention may range from 50 nm to several microns in diameter.

As in the related application, U.S. Ser. No. 11/130,269, previously incorporated by reference, the present invention can use different electrospinning elements to generate a fiber substrate of mixed fibers of different sized fibers. The fiber substrate can have for example one side of the substrate with a larger average fiber diameter than another side of the fiber substrate.

The fibers used in the nanofibers of the present invention include, but are not limited to, acrylonitrile/butadiene copolymer, cellulose, cellulose acetate, chitosan, collagen, DNA, fibrinogen, fibronectin, nylon, poly(acrylic acid), poly(chloro styrene), poly(dimethyl siloxane), poly(ether imide), poly(ether sulfone), poly(ethyl acrylate), poly(ethyl vinyl acetate), poly(ethyl-co-vinyl acetate), poly(ethylene oxide), poly(ethylene terephthalate), poly(lactic acid-co-glycolic acid), poly(methacrylic acid) salt, poly(methyl methacrylate), poly(butyl methacrylate), poly(benzyl methacrylate), poly(lauryl methacrylate), polyacrylates, poly(methyl styrene), poly(styrene sulfonic acid) salt, poly(styrene sulfonyl fluoride), poly(styrene-co-acrylonitrile), poly(styrene-co-butadiene), poly(styrene-co-divinyl benzene), poly(vinyl acetate), poly(vinyl alcohol), poly(vinyl chloride), poly(vinylidene fluoride), polyacrylamide, polyacrylonitrile, polyamide, polyaniline, polybenzimidazole-polycaprolactone, polycarbonate, poly(dimethylsiloxane-co-polyethyleneoxide), poly(etheretherketone), polyethylene, polyethyleneimine, polyimide, polyisoprene, polylactide, polypropylene, polystyrene, polysulfone, polyurethane, poly(vinylpyrrolidone), proteins, SEBS copolymer, silk, and styrene/isoprene copolymer.

Additionally, nanofibers containing polymer blends can also be produced as long as the two or more polymers are soluble in a common solvent. A few examples would be: poly(vinylidene fluoride)-blend-poly(methyl methacrylate), polystyrene-blend-poly(vinylmethylether), poly(methyl methacrylate)-blend-poly(ethyleneoxide), poly(methyl methacrylate)-blend-poly(butyl methacrylate), poly(hydroxypropyl methacrylate)-blend poly(vinylpyrrolidone), poly(hydroxybutyrate)-blend-poly(ethylene oxide), poly(methyl methacrylate)-blend-poly(lauryl methacrylate), protein blend-polyethyleneoxide, polylactide-blend-polyvinylpyrrolidone, polystyrene-blend-polyester, polyester-blend-poly(hyroxyethyl methacrylate), poly(ethylene oxide)-blend poly(methyl methacrylate), poly(hydroxystyrene)-blend-poly(ethylene oxide).

Light Emitter Embedment

In general, FIG. 5 is a flow chart illustrating the first above-noted method for forming a luminescent device according to an embodiment of the present invention in which stimulatable particles 4 are included in an electrospun polymer. At 500, a polymer solution including stimulatable particles (e.g., light stimulatable particles) is electrospun using conditions described above. At 510, from the electrospun solution, nanofibers are formed having a diameter between 100 and 5000 nm and including the stimulatable particles. At 520, the nanofibers are collected to form a fiber substrate.

The process at 500 reflects the general techniques described above for electrospinning nanofibers preferably under controlled conditions. At 500, care is taken to sonicate the stimulatable compounds in solvent prior to mixing with the polymer in the reservoir 30 to ensure adequate dispersion. Adequate dispersion results in a uniform distribution of the stimulatable particles throughout the resultant fiber substrate. Normally, a sonication time greater than 24 hours is sufficient to obtain a uniform luminescent compound suspension in the solution. The ratio of polymer to luminescent compound in the solution will typically range from 1:50 to 100:1

Further, according to one embodiment of the present invention, a local concentration of the stimulatable particles in the polymer solution that is too high can result in deleterious agglomeration of these compounds. FIG. 6A is a schematic of a stimulatable particle 4 (i.e., quantum dot, luminescent or light stimulatable compound) dispersion in a polymer matrix 10 at a concentration where agglomeration is at a low concentration, and typically is not a factor. FIG. 6B is a schematic of a quantum dot 4 dispersion in a polymer matrix 10 at a concentration where agglomeration is a factor. Agglomeration can become an issue even at low concentrations, since small particles often experience electrostatic attraction. However, the present invention utilizes the high surface area nanofibers to reduce particle agglomeration presumable due to the ability of the high surface area nanofiber to accommodate large amounts of particles.

In one embodiment of the present invention, agglomeration is undesirable since it results in non-uniformity in the dispersion of the luminescent compound in the resultant fibers. Agglomeration can change the color uniformity of the resultant light emissions. In addition, agglomeration also degrades the optical properties of the luminescent compound by causing a red-shifting of the emission frequency and a reduction of emission intensity due to quenching or self-absorption.

The size distribution of the nanoparticles can be controlled by managing a number of parameters such as for example: changing an organic phase of a solvent system, changing a temperature at which the nanoparticles are formed, alternating reactant concentrations used to form the nanoparticles, changing the capping molecule chemistry, adding surfactants to control a coagulation of the material from which the nanoparticles are to be formed, applying an electrical or magnetic field during particle nucleation, applying acoustical energy during the formation of the nanoparticles, etc.

The capping molecule chemistry can include for example forming a shell around the nanoparticle (i.e., the quantum dot) to chemically stabilize the nanoparticle. The surfactants (e.g., organic ligands) can be included around and attached to the outside of the shells to promote solution and prevent agglomeration. Such surfactants help prevent agglomeration of particles when the particles are created or used in a dry state. Alternatively, a separation method such as electrophoretic separation can be used after the particle nucleation to achieve a desired particle distribution.

At 500, the electrospinning solution can include additives such as for example organic luminescent materials (dye), ceramics, organo-metallic, carbon, and or metal. For example, the index of refraction of the nanofibers can be increased by adding a material with a high dielectric constant, such as a ceramic like $TiO_2$. The additives are incorporated into a polymer to impart desired physical, chemical, or mechanical properties. The additives are usually mixed with the polymer prior to electrospinning and do not generally form strong chemical bonds with the polymer. Examples of common additives found in polymers suitable for the present invention include pigments (e.g., titanium dioxide), conductive materials (e.g., carbon or metallic flakes), UV stabilizers, and glass reinforcements.

At 510, the conditions in the electrospinning environment are controlled. U.S. Ser. No. 10/819,945 entitled "Electrospinning in a Controlled Gaseous Environment" describes techniques applicable to the present invention for controlling the electrospraying environment. Additionally, refinements of the electrospinning process are described in U.S. application Ser. No. 10/819,916, entitled "Filter Incorporating Nanofibers," previously incorporated herein by reference. The practices described therein can be used in the present invention to produce small diameter nanofibers whose large surface to volume ratio can enhance the brightness of the light emitted from the resultant fiber substrate and whose average fiber diameter size is appropriately sized to match the incident light source wavelength.

At 520, techniques in U.S. application Ser. No. 10/819,916, entitled "Electrospinning of Fibers using a Rotatable Spray Head" to obtain aligned fibers or techniques in U.S. application Ser. No. 10/819,916, entitled "Filter Incorporating Nanofibers" can be used to improve fiber mat density and uniformity.

Light Emitter Incorporation onto Nanofibers During Electrospinning

Figure 7:
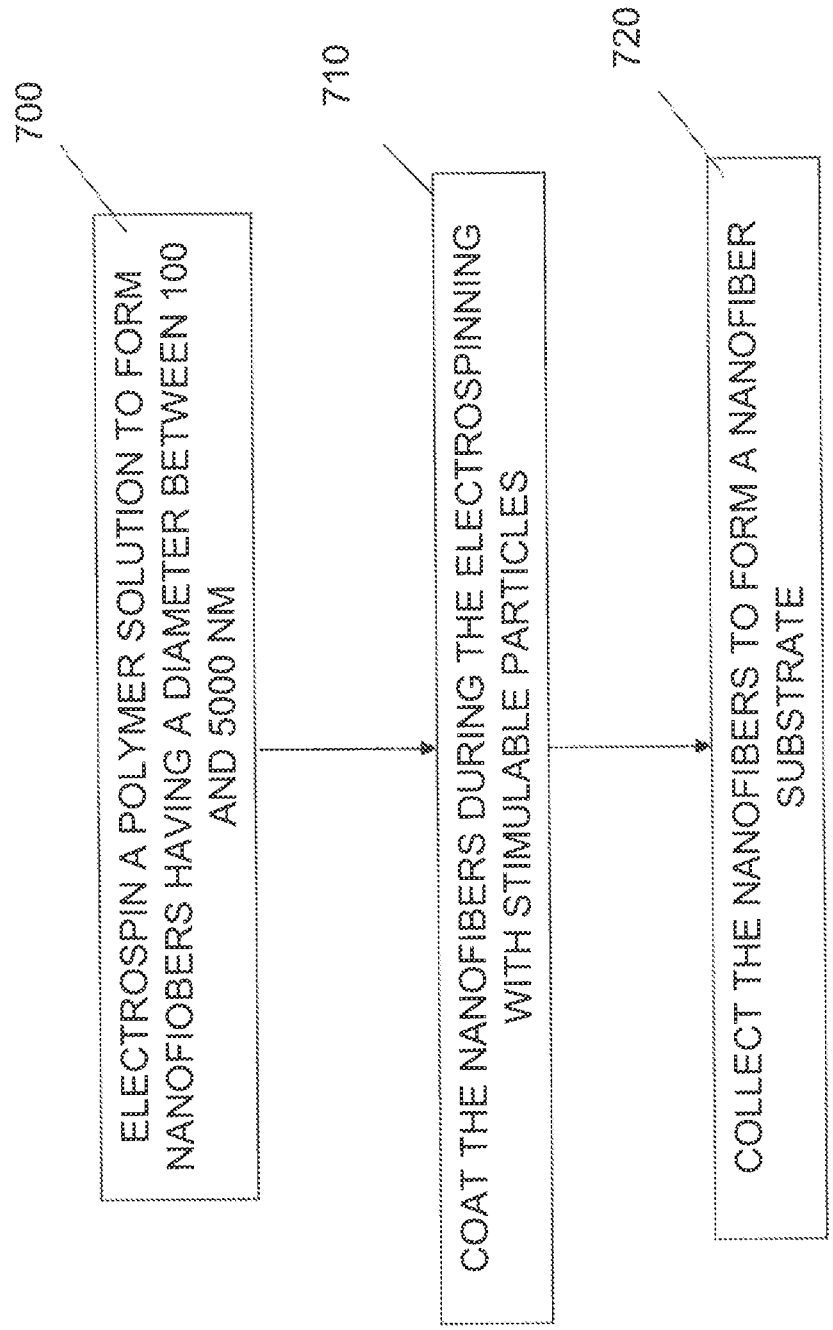
FIG. 7 is a flow chart illustrating a method for forming a luminescent device according to an embodiment of the present invention in which luminescent particles are attached to the electrospun fiber during the electrospinning process.

In one embodiment of the present invention, as discussed above, stimulatable particles 4 can be applied to the electrospun fibers 2 as the fibers are coalescing into a resultant fiber substrate 6. FIG. 7 is a flow chart illustrating a method for forming a luminescent device according to an embodiment of the present invention in which stimulatable particles 4 are attached to the electrospun fiber during the electrospinning process. At 700, a polymer solution is electrospun to form nanofibers having a diameter between 100 and 5000 nm. At 710, the nanofibers are coated during the electrospinning with stimulatable particles 4. At 720, the nanofibers are collected to form a fiber substrate 6.

In this embodiment, the stimulatable particles 4 become positioned at or near the surface of the nanofiber as shown in FIG. 2B. The process at 700 is similar to the process at 500 reflecting the general techniques described above for electrospraying nanofibers in one embodiment under controlled conditions. At 710, stimulatable particles 4 are attached onto a surface of the electrospun fibers before the electrospun fibers have dried. At 710, the stimulatable particles 4 can be introduced by an electrospray beam directed to a position removed from an electrospraying tip electrospinning the polymer solution. FIG. 4 shows an electrospray unit 48 for introducing the stimulatable particles 4 into the electrospinning environment 46.

Low agglomeration of stimulatable particles 4 can be achieved by separating the nanofiber formation and light stimulatable particle attachment steps. This can be achieved in one embodiment of the present invention by introducing for example stimulatable particles 4 (such as from an electrospray solution) into a region where an emerging nanofiber is drying. In an electrospray introduction technique, submicron droplets of the stimulatable particle suspensions are generated by electrostatically disrupting a droplet of a solvent (such as for example toluene) containing the stimulatable particles. The electrosprayed droplets are highly charged (usually positively charged) and do not aggregate due to repulsion of similar charges during their passage to the surface of the polymer nanofiber 6 that, in one embodiment, can be carrying an opposing electrical charge.

Since the nanofiber is drying during ejection from the needle, in one embodiment of the present invention, the location of the electrospray controls the penetration of the stimulatable particles 4 into the nanofiber 2. For example, if the electrospray beam is moved closely to the electrospraying tip, the nanofibers will likely be softer since they will contain more solvent and the stimulatable particles 4 will embed deeper into the fiber. Alternatively, if the electrospray beam is moved away from the electrospraying tip and closer to the collector, the nanofibers will be drier and the stimulatable particles will be restricted to the surface. Other parameters such as the solvent used to disperse the stimulatable particles may also influence the penetration depth of the electrosprayed stimulatable particles.

At 710, the processes described in U.S. Ser. No. 10/819,945 entitled "Electrospinning in a Controlled Gaseous Environment" for controlling the electrospraying environment to influence (retard) the drying rate of the electrospun fibers are applicable. At 710, the processes described in U.S. Ser. No. 11/130,269 entitled "Nanofiber Mats and Production Methods Thereof" with regard to the delivery and incorporation of particles into fibers are applicable to the present invention.

The process at 720 is similar to the processes described above at 520.

Light Emitter Incorporation onto Nanofibers After Electrospinning

Figure 8:
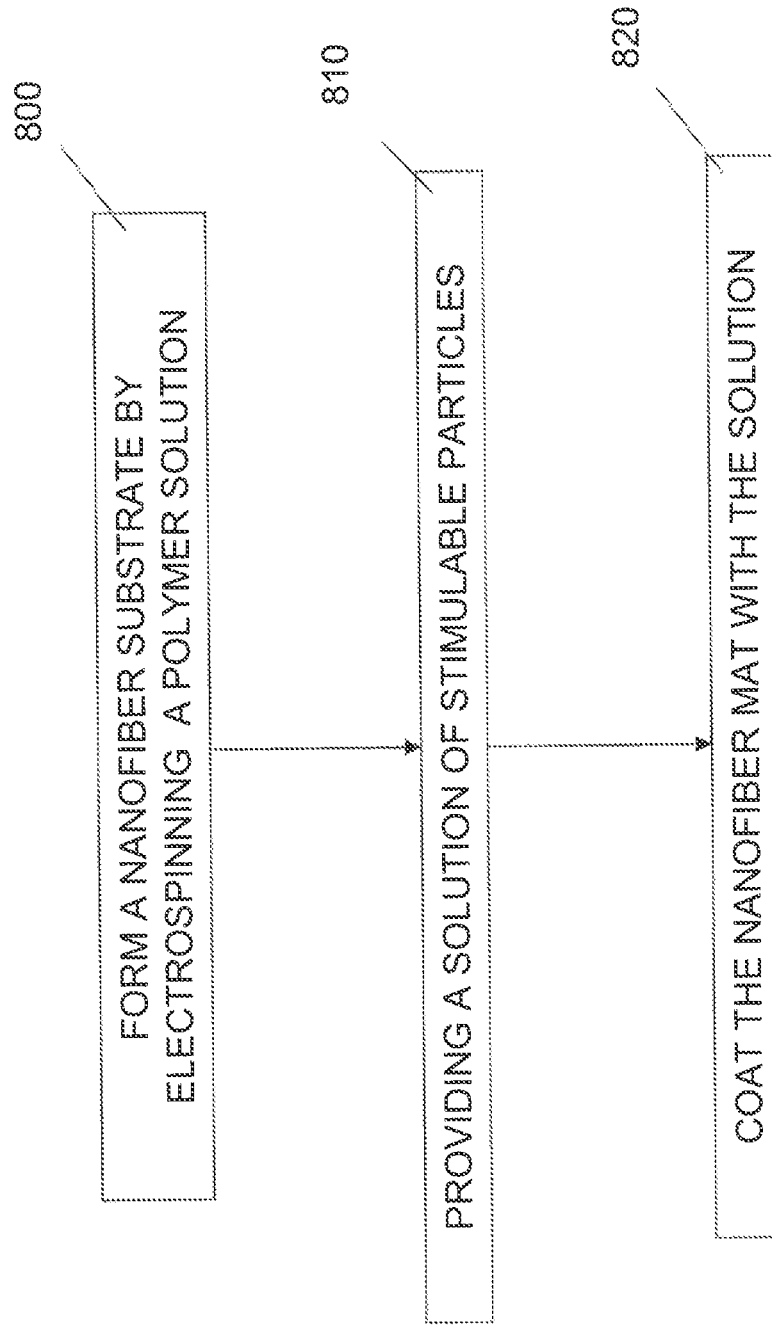
FIG. 8 is a flow chart illustrating a method for forming a luminescent device according to an embodiment of the present invention in which luminescent particles are attached to the electrospun fiber after the electrospinning process.

In one embodiment of the present invention, as discussed above, light stimulatable particles such as for example quantum dots can be applied to the fiber substrates after electrospinning. This embodiment is illustrated in FIG. 8. According to this embodiment of the present invention, a fiber substrate is formed in 800 by electrospinning methods such as for example the techniques described above. At 810, a solution containing the stimulatable particles 4 is provided (such as the polymer solution in FIG. 6A). At 820, the nanofiber substrate 6 is coated with the solution. The solution may be selected such that the fiber substrate does not dissolve but may slightly swell the polymers existing in the fiber substrate 6.

During the coating process, the polymer nanofibers may swell due to the solvent. This expansion of the fibers in the network also expands the spaces between the fibers, thus opening the network spaces to allow the particles to move in between. Thus, the particles move to the fiber surface due to the Brownian motion. The fiber substrate 6 may be immersed in the solution for a period of 1 minute to 72 hours and may be rinsed with a solvent for 0-60 seconds to ensure the removal of any loosely attached surface particles. The fiber substrate 6 may then be placed onto a support and allowed to completely dry under room temperature before use.

Figure 9:
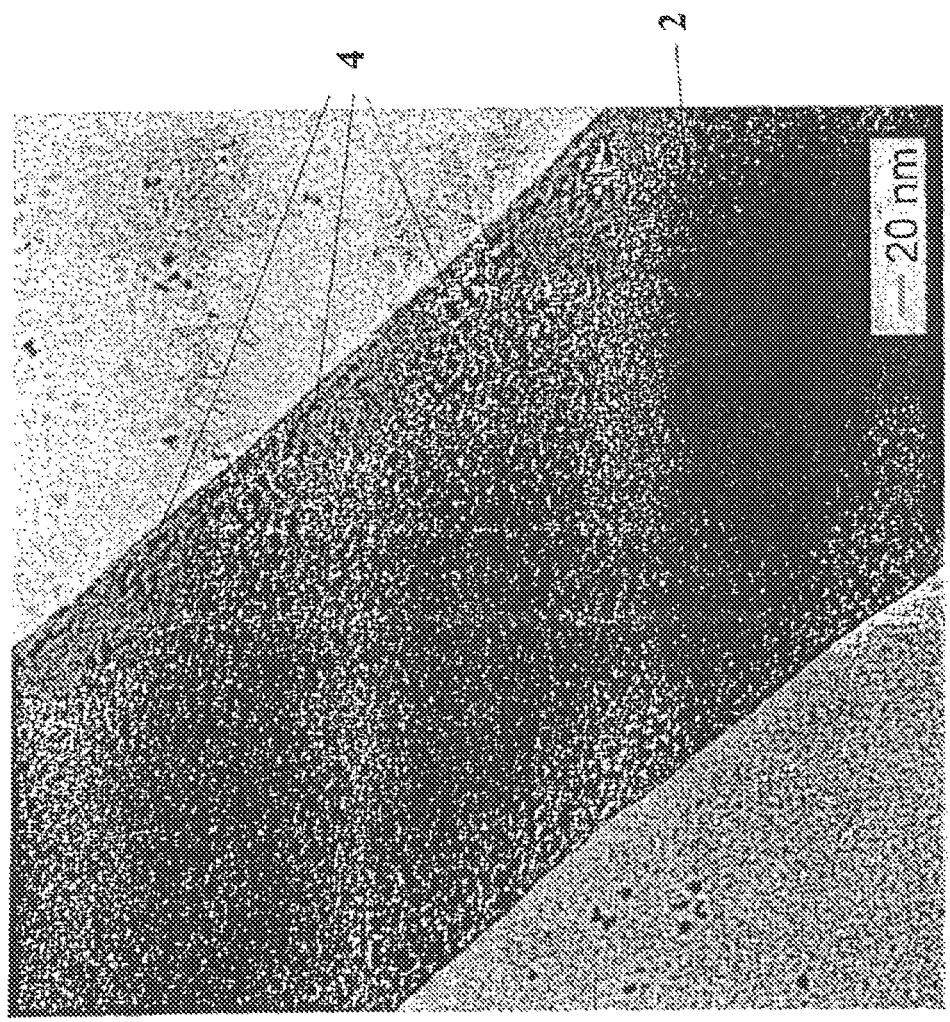
FIG. 9 is a transmission electron microscopy image of a polymer/QD composite nanofiber prepared using the method illustrated in FIG. 8.

FIG. 9 is a transmission electron microscopy image of a polymer/quantum dot composite nanofiber prepared using the method illustrated in FIG. 8. Individual quantum dots 4 are visible at both outside and inside of the fiber 2 in the transmission electron microscopic image of a decorated fiber as shown in FIG. 9. The size of the quantum dots indicates almost no aggregation of the dots.

The surface density of the light stimulatable particles on the polymer nanofibers made according to the method of the present invention described in FIG. 8 is controllable by changing variables such as the immersion time of the fibers, particle solution concentration, the solvent composition, and temperature. The factors such as higher temperature that increase Brownian motion and softens the nanofiber matrix (trace solvents mixed with the non-solvent used in the process) may control both the surface coverage as well as the degree of embedment of the particles on the fiber. Based on microscopy and the mechanics of the process, the quantum dots (or light emitting particles) embedment may be localized in the periphery of the nanofibers.

While light emitting particle incorporation into a matrix such as a fiber or fiber substrate described in the present invention, this aspect of the present invention is not so limited to electrospinning and fibers. A variety of processes, including the above-noted electrospinning, and other conventional techniques such as spray coating, drop coating, spin coating, transfer printing, thermal printing, ink-jet printing, aerosol handling, electrostatic method, extrusion of filled polymers, self-assembled monolayers, etc. can be used according to the present invention to form a matrix having a predetermined distribution of luminescent or light stimulatable compounds. In those examples, the matrix need not be electrospun fibers and provides a host upon which exposure to a solvent containing a dispersion of the light emitting particles will result in the application of the particle (i.e., quantum dots, phosphors, nanophosphors, or electroluminescent particles) to the matrix. The matrix material is preferably organic-based but could include sol-gel materials containing inorganic bases.

Relative Light Emitter Distribution

In one embodiment of the present invention, the luminescent compounds used to make the light stimulatable devices of the present invention are nanoparticles forming for example either quantum dots or nano-phosphors. Quantum dots (i.e., the stimulatable particles 4) emit electromagnetic waves at wavelengths that depend, to a first approximation, on the diameter of the nanoparticles. For example, CdSe nanoparticles of 2.8 nm nominal diameter emit green light at roughly 530 nm, whereas CdSe nanoparticles of 5.0 nm nominal diameter emit red light at roughly 625 nm. The mixing of specific particles (each having a characteristic wavelength emission) can be used in the present invention to produce "white light" similar to the mixing techniques used in the mixing of phosphors for fluorescent lights.

In one embodiment of the present invention, the nominal sizes disclosed for the stimulatable particles can have a variance in size distribution or surface structure that results in broad-band (as compared to discrete or line emissions). For example, quantum dots of a narrow size distribution that do not contain an inorganic shell layer may exhibit broadband emission due to excitation of surface defects and traps. An example of such materials is found in Bowers et al. Journal of the American Chemical Society vol. 127 (2005) pages 15378-15379 the entire contents of which are incorporated here by reference. Likewise, broad size distributions of core shell quantum dots can be produced by controlling the parameters of the reaction used to synthesize them. The broad band emissions emulate black body radiation sources. Luminescent devices of the present invention exhibiting broad band emissions have a higher color rendering index.

In one embodiment of the present invention, because nanoparticles emit light having a wavelength depending on the diameter of the nanoparticles, white light may be generated from a fiber substrate having different diameter nanoparticles dispersed throughout. For example, nanoparticles having a first diameter may produce an electromagnetic wave having a first wavelength, nanoparticles having a second diameter may produce an electromagnetic wave having a second wavelength, and so on until the plurality of nanoparticles produce all the wavelengths necessary to produce a desired spectrum such as that of a blackbody radiator having a CRI approaching 100. In some instances, it may be necessary to physically separate the different nanoparticle sizes in order to avoid undesired absorption of secondary emissions. This can be accomplished in one embodiment of the present invention by using a substrate, such as the nanofibers described above, having strong light scattering properties for select wavelengths.

Below are examples of such mixtures determined with regard to various excitation sources:

EXAMPLE 1

Excitation Source: Blue LED at 450-460 nm

Luminescent compound: a single variety of CdSe/ZnS core shell quantum dots with particle diameter 2.6-3.2 nm (configured for yellow emission and commercially available from Evident Technologies)

Such yellow emitting quantum dots in this example are incorporated into and onto the fibers at weight percentages between 0.1% and 30% (weight quantum dots/weight fiber) with a more suitable range of weight percentage between 1% and 10% depending upon desired light output.

When packaged with the blue LED emitting at 450-460 nm, the blue light from the LED and the yellow emission from the photoluminescent fiber in this example blend to produce white light.

EXAMPLE 2

Excitation Source: Blue LED at 450-460 nm

Luminescent compound: Two different sizes of CdSe/ZnSe core shell quantum dots with the particle diameter of the first size being 2.4 nm (green emission) and the particle diameter of second size being 5.2 nm (red emission) (purchased from Evident Technologies).

These two sizes of luminescent quantum dots are incorporated into and onto the fibers at weight percentages between 0.1% and 30% (total weight quantum dots/weight fiber) with a more suitable range of weight percentage between 1% and 10%. The ratio of green particles to red particles incorporated into and on the fibers varies between 1:1 to 20:1 depending upon desired light output. In order to prevent undesired absorption of secondary emissions, it may be preferable to physically separate the two sizes of luminescent quantum dots. This can be achieved in one embodiment of the present invention by locating the quantum dots on separate sides of the fiber substrate or by placing the quantum dots in different zones or pixels on the same side of the fiber substrate.

When packaged with a blue LED emitting at 450-460 nm, the blue light from the LED and the green and yellow emission from the photoluminescent fiber in this example blend to produce white light.

EXAMPLE 3

Excitation Source: Violet LED at 408 nm

Luminescent compound: Three different sizes of CdSe/ZnSe core shell quantum dots with the particle diameter of the first size being 1.9 nm (blue emission), the particle diameter of the second size being 2.4 nm (green emission), and the particle diameter of third size being 5.2 nm (red emission) (purchased from Evident Technologies).

These three sizes of luminescent quantum dots are incorporated into and onto the fibers at weight percentages between 0.1% and 100% (total weight quantum dots/weight fiber) with a more suitable range of weight percentage between 1% and 50%. The ratio of blue particles to green particles to red particles incorporated into and on the fibers is chosen to produce light emissions with relative intensities between 1:2:3 (for "warm white" color) to 2.5:1.5:1 (for "cool white" color) depending upon desired light output. In order to prevent undesired absorption of secondary emissions, it may be preferable to physically separate the three sizes of luminescent quantum dots. This can be achieved by locating the quantum dots on separate sides of the fiber substrate or by placing the quantum dots in different zones or pixels on the same side of the fiber substrate.

When packaged with a violet emitting LED at 408 nm, white light is produced in this example by blending the emission of blue, red, and green colors by the photoluminescent nanofiber. Little to no visible radiation from the LED contributes directly to the white light product.

EXAMPLE 4

Excitation Source: UV LED at 350-370 nm

Luminescent compound: Three different sizes of CdSe/ZnSe core shell quantum dots with the particle diameter of the first size being 1.9 nm (blue emission), the particle diameter of the second size being 2.4 nm (green emission), and the particle diameter of third size being 5.2 nm (red emission) (purchased from Evident Technologies, 45 Ferry Street Troy, N.Y. 12180).

These three sizes of luminescent quantum dots are incorporated into and onto the fibers at weight percentages between 0.1% and 100% (total weight quantum dots/weight fiber) with a more suitable range of weight percentage between 1% and 50%. The ratio of blue particles to green particles to red particles incorporated into and on the fibers is chosen to produce light emissions with relative intensities between 1:2:3 (for "warm white" color) to 2.5:1.5:1 (for "cool white" color). In order to prevent undesired absorption of secondary emissions, it may be preferable to physically separate the three sizes of luminescent quantum dots. This can be achieved in one embodiment of the present invention by locating the quantum dots of different sizes on separate sides of the fiber substrate or by placing these quantum dots in different zones or pixels on the same side of the fiber substrate.

When packaged with a UV emitting LED at 350-370 nm, white light is produced by the blending of emissions of the blue, red, and green colors by the photoluminescent nanofiber.

EXAMPLE 5

Excitation Source: Blue LED at 450-470 nm

Luminescent compound: Green phosphors such as the sulfoselenide compositions sold by PhosphorTech [Lithia Springs, Ga.] can be applied to an uncoated nanofiber using the coating processes of drop coating, spray coating, screen printing, or dip coating. Added to this composite were red emitting quantum dots using processes such as ink-jet printing, spray coating, dip coating, or drop coating. When this construct is packaged with a blue emitting LED at 450 to 470 nm, white light is produced in this example by blending the emissions of the green phosphor, red quantum dot, and blue LED.

EXAMPLE 6

Excitation Source: Blue LED at 450-470 nm

Luminescent compound: Green phosphors such as the sulfoselenide compositions sold by PhosphorTech [Lithia Springs, Ga.] can be applied to an uncoated nanofiber using the coating processes of drop coating, spray coating, screen printing, or dip coating. When this construct is packaged with a blue emitting LED at 450 to 470 nm and a red-orange emitting LED at 610 to 620 nm, white light is produced in this example by blending the emissions of the green phosphor, red-orange LED, and blue LED.

EXAMPLE 7

Excitation Source: Blue LED at 450-470 nm

Luminescent compound: Green phosphors such as Eu-doped silicates sold by Internatix [Fremont, Calif.] can be applied to an uncoated nanofiber using the coating processes of drop coating, spray coating, screen printing, or dip coating. Added to this composite were red emitting quantum dots using processes such as ink-jet printing, spray coating, dip coating, or drop coating. When this construct is packaged with a blue emitting LED at 450 to 470 nm, white light is produced in this example by blending the emissions of the green phosphor, red quantum dot, and blue LED.

EXAMPLE 8

Excitation Source: Blue LED at 450-470 nm

Luminescent compound: Green phosphors such as Eu-doped silicates sold by Internatix [Fremont, Calif.] can be applied to an uncoated nanofiber using the coating processes of drop coating, spray coating, screen printing, or dip coating. When this construct is packaged with a blue emitting LED at 450 to 470 nm and a red-orange emitting LED at 610 to 620 nm, white light is produced in this example by blending the emissions of the green phosphor, red-orange LED, and blue LED.

EXAMPLE 9

Excitation Source: Blue LED at 450-470 nm

Luminescent compound: Yellow phosphors such as Ce-doped yttrium aluminum garnet sold by Internatix [Fremont, Calif.] can be applied to an uncoated nanofiber using the coating processes of drop coating, spray coating, screen printing, or dip coating. Added to this composite were red emitting quantum dots using processes such as ink-jet printing, spray coating, dip coating, or drop coating. When this construct is packaged with a blue emitting LED at 450 to 470, white light is produced in this example by blending the emissions of the green phosphor, red quantum dot, and blue LED.

EXAMPLE 10

Excitation Source: Blue LED at 450-470 nm

Luminescent compound: Yellow phosphors such as Ce-doped yttrium aluminum garnet sold by Internatix [Fremont, Calif.] can be applied to an uncoated nanofiber using the coating processes of drop coating, spray coating, screen printing, or dip coating. When this construct is packaged with a blue emitting LED at 450 to 470 nm and a red-orange emitting LED at 610 to 620 nm, white light is produced in this example by blending the emissions of the green phosphor, red-orange LED, and blue LED.

Luminescent Devices

Figure 10:
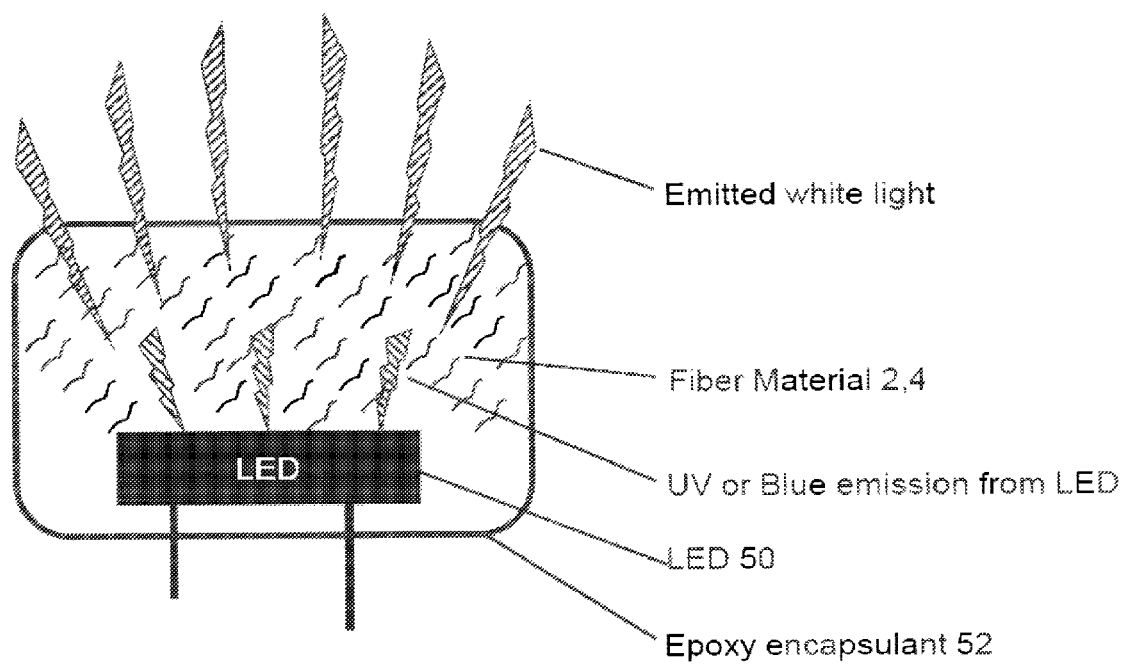
FIG. 10 is a schematic depicting according to one embodiment of the present invention a configuration in which a light emitting diode (LED) couples light through an encapsulant to the fibers including the luminescent materials.
Figure 11:
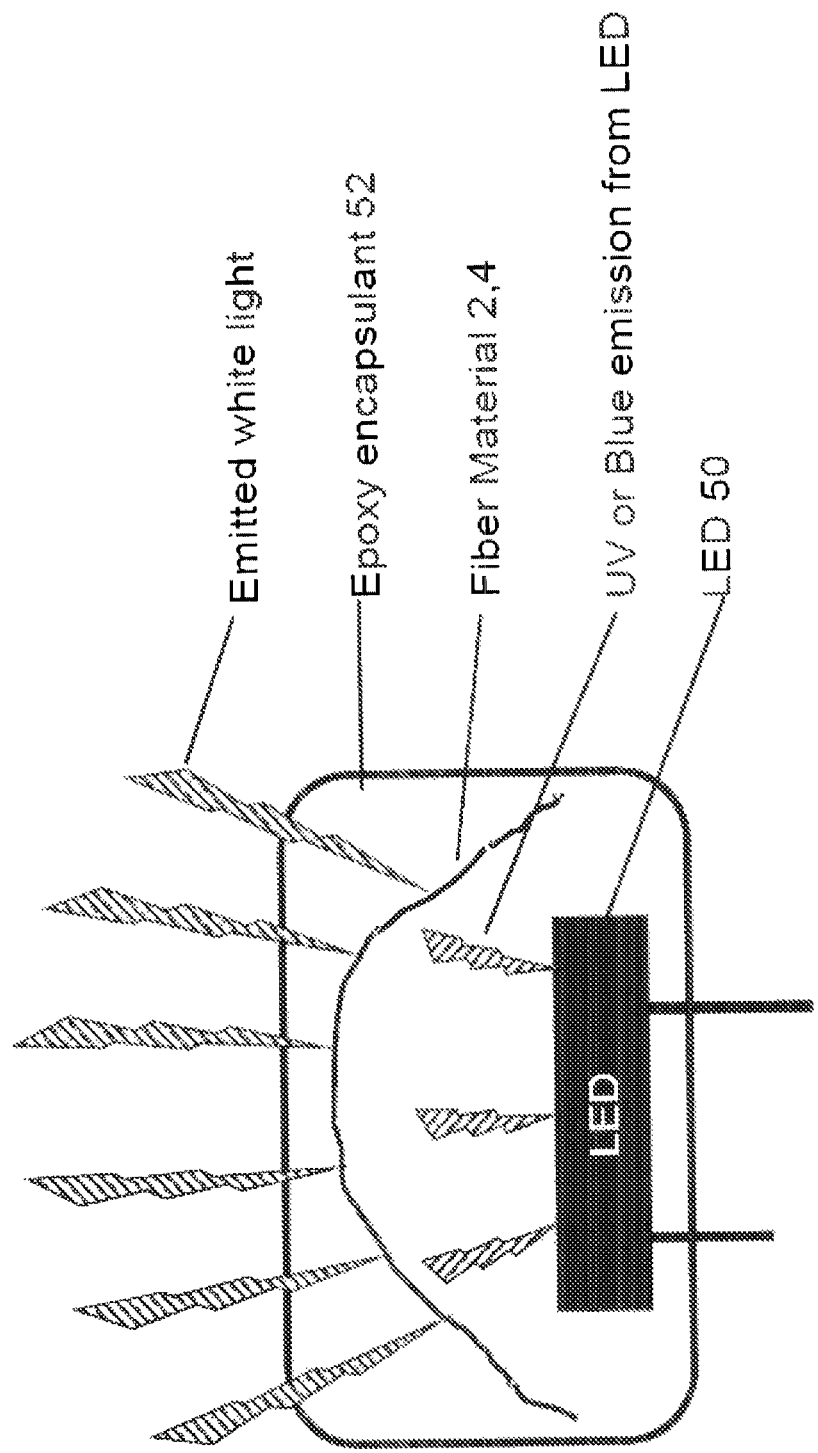
FIG. 11 is a schematic depicting according to one embodiment of the present invention a configuration in which a light emitting diode (LED) couples light through an encapsulant containing therein fibers including the luminescent materials.

In one embodiment of the present invention, a polymeric substrate such as an electrospun fiber substrate including luminescent materials is included in an encapsulant such as for example an epoxy matrix. FIG. 10 is a schematic depicting according to one embodiment of the present invention a configuration in which a light emitting diode (LED) couples light through an encapsulant to the fibers including the luminescent or light stimulatable particles. More specifically, FIG. 11 shows LED 50 emitting UV or blue light through a nanofiber materials 2, 4 having a certain distribution of stimulatable particles such as quantum dots (not shown). The UV or blue light emitted by LED 50 constitutes the incident light for the nanofiber materials 2, 4. The stimulatable particles 4 (e.g., the phosphors or quantum dots) absorb the incident light, and depending on their properties, emit white light. The fiber substrate materials 2, 4 are encapsulated, for example, in an epoxy or silicone encapsulant 52. The epoxy 52 may encapsulate both the LED 50 and the fiber substrate materials 2, 4, either completely or partially. The fiber substrate materials 2, 4 may include quantum dots of sizes varying from approximately 1.5 nm to 10 nm or one or more phosphors to produce a light emission across the desired portion of the visible spectrum. The concentration of various stimulatable particles is controlled, in one embodiment of the present invention, to provide high quality white light similar to solar emissions.

In other examples, a higher concentration of red emitters than blue emitters may be chosen for other non-white light applications. Thus, the present invention permits both monochromatic and color-distinctive luminescent structures to be made by the respective placement of the appropriate luminescent particle in respective areas of the luminescent structure. Prefabricated polymer substrates including nanofiber substrates of respective emission colors (i.e., white, red, blue, green, or a color combination) can be cut and placed in the respective areas, such that a common light source coupled for example through a fiber optic cable would produce different light from the respective areas.

According to another embodiment of the present invention, the substrate may be directly placed on the surface of the LED 50 before the encapsulation with epoxy. This placement may reduce energy losses from absorption of some wavelengths (e.g., blue or UV) in the epoxy. Stimulatable particles 4 such as the quantum dots may be concentrated near the LED, in a proximate phosphor configuration, for a maximum absorbing effect. Further as part of the bonding of the nanofiber substrate to the LED, interstices in the fibers may be filled with a low refractive index polymer, such as silicone, to optimize the scattering effects required to trap the UV light.

FIG. 10 is a schematic depicting according to one embodiment of the present invention a configuration in which a light emitting diode (LED) 50 couples light through an encapsulant 52 containing therein fibers 2 including the stimulatable particles 4. In this embodiment, as shown in FIG. 10, the nanofiber substrate including the stimulatable particles 4 has been divided (e.g. chopped) and added as filler to the epoxy encapsulant 52, for example an encapsulant typically used in LEDs. An alternative approach is to disperse the fibers by shear of the epoxy. Because the nanofibers may be made small to not interfere with the visible light transparency of the clear epoxy, the optical properties of the epoxy should be unaffected.

Some advantages of the various embodiments of the present invention as compared to the traditional technology include: 1) providing a luminescent material with broad spectral emission can be created by incorporating a distribution of particles into the light stimulatable devices of the present invention; 2) creating such a structure requires less solvent than the casting or electrophoretic methods currently in use for phosphors; 3) allows emission, transmission, and scattering properties of the luminescent material to be controlled separately through a choice of the particle (i.e., particle density, size, composition, etc.) and nanofiber geometry (i.e., length, diameter, etc.); 4) allows for more efficient operation of the photoluminescent converter due to higher surface area and control of the fiber geometry; and 5) provides a more convenient process to handle and process nanoparticles in finished devices than alternative approaches.

Lighting Devices

A lighting device of the present invention includes a reflector, a mechanism for excitation illumination, and a mechanism for supporting luminescent sheets (formed from the luminescent particle/fiber composites described above). This lighting device can be used by itself as a luminaire (i.e., lighting fixture) or in some cases can be used as a lamp that is contained in a luminaire. The reflector configuration including the mechanism for exciting illumination and the mechanism for supporting luminescent sheets provides for efficient light conversion and emission from the luminescent particle/polymer composites described above. The reflector configuration of the present invention is configured to accommodate the light-conversion material in a structure taking advantage of the light scatter from the nanoparticle/nanofiber composites described above. The reflector can be chosen to provide either specular or diffuse reflectance. One example of a specular reflector is a polished Al substrate. An example of a diffuse reflector is a thick (>5 µm) nanofiber substrate as shown in FIG. 13B.

As described above, the luminescent particle/polymer fiber composites include luminescent nanoparticles supported by organic nanofibers. This aspect of the invention permits the luminescent nanoparticles to effectively be suspended in air by the nanofibers. Most light-conversion phosphors in conventional white-light LEDs (light emitting diodes) are held within a solid material having a significant index of refraction, and various strategies are used with these materials to overcome total internal reflection and to extract the light efficiently from the solid material. The luminescent particle/polymer composites, including nanoparticle/nanofiber composites, (hereinafter referred to as "the luminescent sheet") described above do not suffer from total internal reflection.

In the present invention, light conversion is to accept short-wavelength light and to convert the short-wavelength light to longer wavelengths. The combination of an LED producing short-wavelength light (for example, blue light) and an appropriate light-conversion mechanism (for example, one producing yellow light) provides an efficient way of producing white light for general illumination. In one embodiment of the present invention, a range of incident (excitation) wavelengths are used which provide excitation (for example, light ranging from blue to ultraviolet). In one embodiment of the present invention, the light-conversion mechanism of the particles emits a single color in response to the excitation light. In one embodiment of the present invention, the light-conversion mechanism of the particles emits a broad band of wavelengths representing a wide range of colors (for example, from blue to red).

Optically Thick Luminescent Sheets:

In this embodiment of the present invention, the light-conversion material is relatively thick or reflective, so that the excitation light will not pass through the luminescent sheet in a significant amount. A value of less than 70% transmittance in general would make the light-conversion material an optically thick material. Under this condition, the luminaire in this embodiment of the present invention is arranged so that at least one side of the luminescent sheet is illuminated by the excitation light, and emitted light is collected from at least one side of the luminescent sheet for emanating from the luminaire.

In one embodiment of the present invention, illumination from the excitation light source does not directly escape the luminaire. Accordingly, any light escaping the luminaire in this embodiment includes both 1) a component of the excitation light has been scattered from a matrix of the luminescent sheets without a change in wavelength (for example, blue light) and 2) emitted light produced by active luminescent particles (for example light having a longer wavelength than the excitation light such as yellow light).

Figure 12:
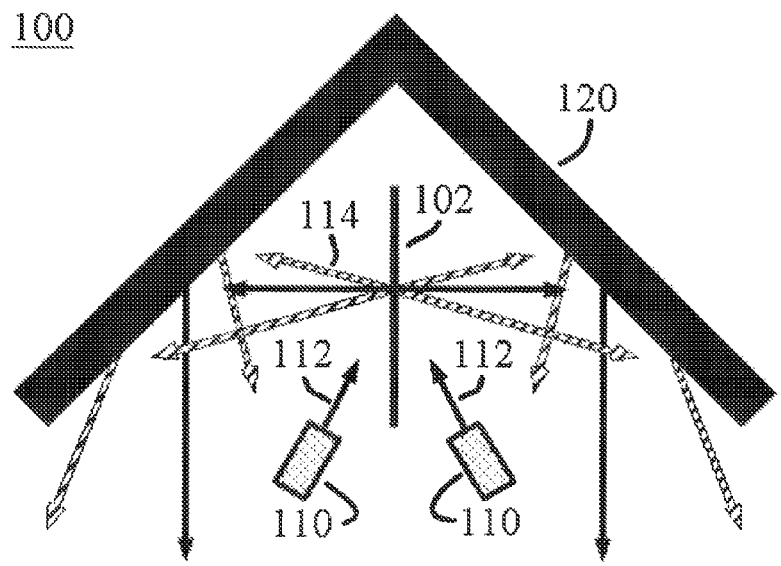
FIG. 12 is a cross-sectional depiction of a luminaire structure according to one embodiment of the present invention.

As shown in FIG. 12, light sources 110 (producing the excitation light) produce light that is directed away from the exit of the luminaire shown at the bottom of the luminaire.

FIG. 12 is a cross-sectional depiction of a luminaire structure 100 according to one embodiment of the present invention. The vertical center line depicts a luminescent sheet 102. Light sources 110 (e.g., light emitting diodes LEDs or other light sources) produce excitation light 112 which is directed to the luminescent sheets 102. In other embodiments, one or more separate (or integrated) excitation light sources 110 can be provided for each side of the luminescent sheet 102. Luminescent particles in the luminescent sheets 102 upon interaction with the primary light (i.e., excitation light 112) emit secondary light at a wide range of wavelengths, as discussed above in the "Relative Light Emitter Distribution" section. A mirrored reflector 120 reflects light back toward the luminescent sheet 102. Alternatively, reflector 120 can be a diffuse reflector such as provided by a thick nanofiber substrate. The reflector 120 also reflects some light out of the luminaire 100. Excitation light 112 (for example, blue light) thus impinges on the luminescent sheet(s) 102 from multiple angles and impinges on the luminescent sheet(s) 102 on both sides. Some of the excitation light 112 scatters from the luminescent sheet 102 and exits the luminaire 100 at the bottom of the luminaire either directly or by reflection from the reflector 120. Emitted light 114 (for example, yellow light) created in the luminescent sheet can also exit the luminaire 100 at the bottom of the luminaire and can mix with the scattered excitation light 112.

FIG. 12 shows the excitation light 112 incident on the luminescent sheet 102 at a steep oblique angle, which in one embodiment maximizes the interaction of the excitation light with the luminescent sheet 102. The incident angle is a design variable which can be adjusted in the configuration of the luminaire 100 for maximum efficiency depending on the properties of the luminescent sheet 102. In general, the oblique angle varies from an angle of 15° to 85° to a normal to the luminescent sheet. In one embodiment of the invention, the luminescent sheet 102 is shown in a location separated from the reflector 120, allowing emitted light to reflect around the sheet. In general, the position of the luminescent sheet is set to a position for maximum efficiency. Efficiency in this context referring to the ratio of the amount of light produced by the luminaire (integrated over all directions, for example in an integrating sphere) to the power used to operate the luminaire.

Accordingly, in one or more embodiments of the present invention, luminaire 100 includes a source of excitation light (for example, blue LEDs), a luminescent sheet (for example, one that converts blue light to yellow light), and a reflector that directs the scattered light. Light can be directed from the excitation sources obliquely toward the luminescent sheet. The angle between the excitation source and the luminescent sheet is set to a value having the greatest efficiency. Efficiency in this context also referring to the ratio of the amount of light produced by the luminaire (integrated over all directions, for example in an integrating sphere) to the power used to operate the luminaire. The luminescent sheet 102 shown in FIG. 12 is located at a distance from the excitation source 110 and from the reflector 120. The reflector 120 is arranged to reflect light from the scattered and emitted light in a useful direction. While FIG. 12 shows a reflector 120 having two plane mirrors held at a right angle, in other embodiments, the reflector 120 can also be curved surface rather than planar surface, can include facets or surface features, and can be related by angles different from right angles. In other embodiments, the reflector 120 can be a diffuse reflector, such as provided by a thick (>5 μm) nanofiber substrate, to provide a Lambertian distribution of light.

One example of another luminaire 150 according to the present invention is shown in FIG. 13. In this luminaire, blue light (scattered from the luminescent sheet 102) and yellow light (emitted from the luminescent sheet) are mixed to form white-appearing light. For decorative purposes, the mix of luminescent particles can be altered to provide specific colors of illumination. The shape and size of the luminescent sheet 102 and the shapes and sizes of associated reflectors can be altered to provide new design elements for decorative or architectural purposes. Luminescent sheets 102 of various kinds can be arranged to be easily substituted for each other, allowing color or shape to be changed conveniently and inexpensively by the user of the luminaire 100 or 150.

Figure 13A:
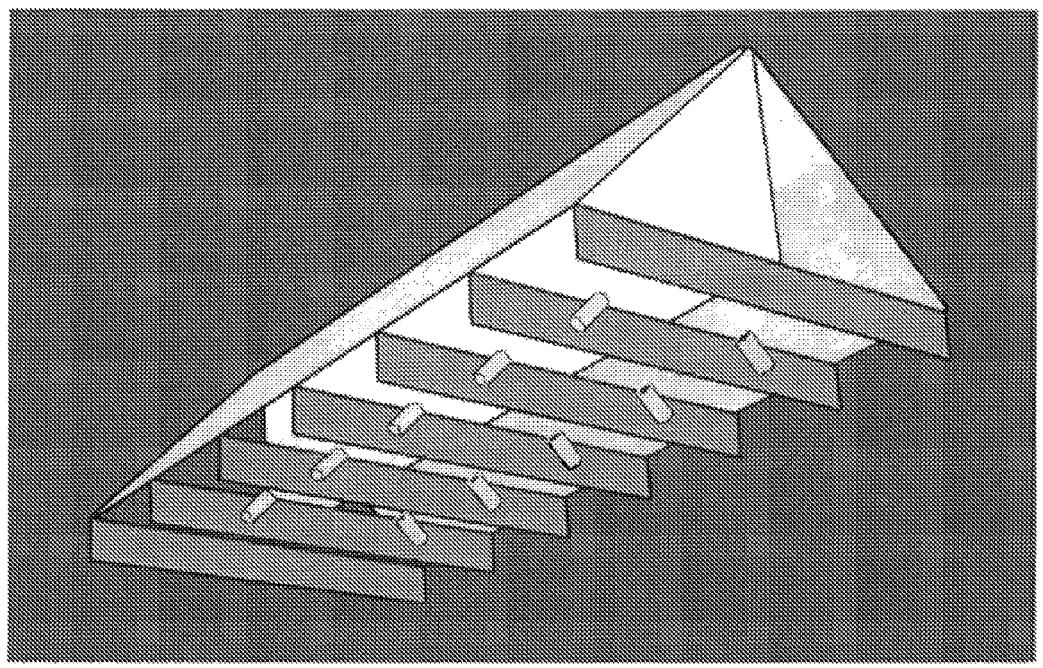
FIG. 13A is a perspective depiction of a similar luminaire structure according to one embodiment of the present invention.

More specifically, FIG. 13A is a schematic depiction of luminaire 150 according to one embodiment of the present invention. The view in FIG. 13A is from underneath the luminaire looking upward toward the planar reflectors 120. The vertical plane in the middle of luminaire 150 depicts luminescent sheet(s) 102 that converts a part of the excitation light from light sources 110 to secondary, emitted light. In this example the luminescent sheet is in contact with the reflector, unlike the example shown in FIG. 12. Cross-members 114 on the lower part of the luminaire 150 hold light sources 110 for producing the excitation light. The reflectors 120 (e.g., the reflective mirror planes) direct light out the bottom of luminaire 150.

Figure 13C:
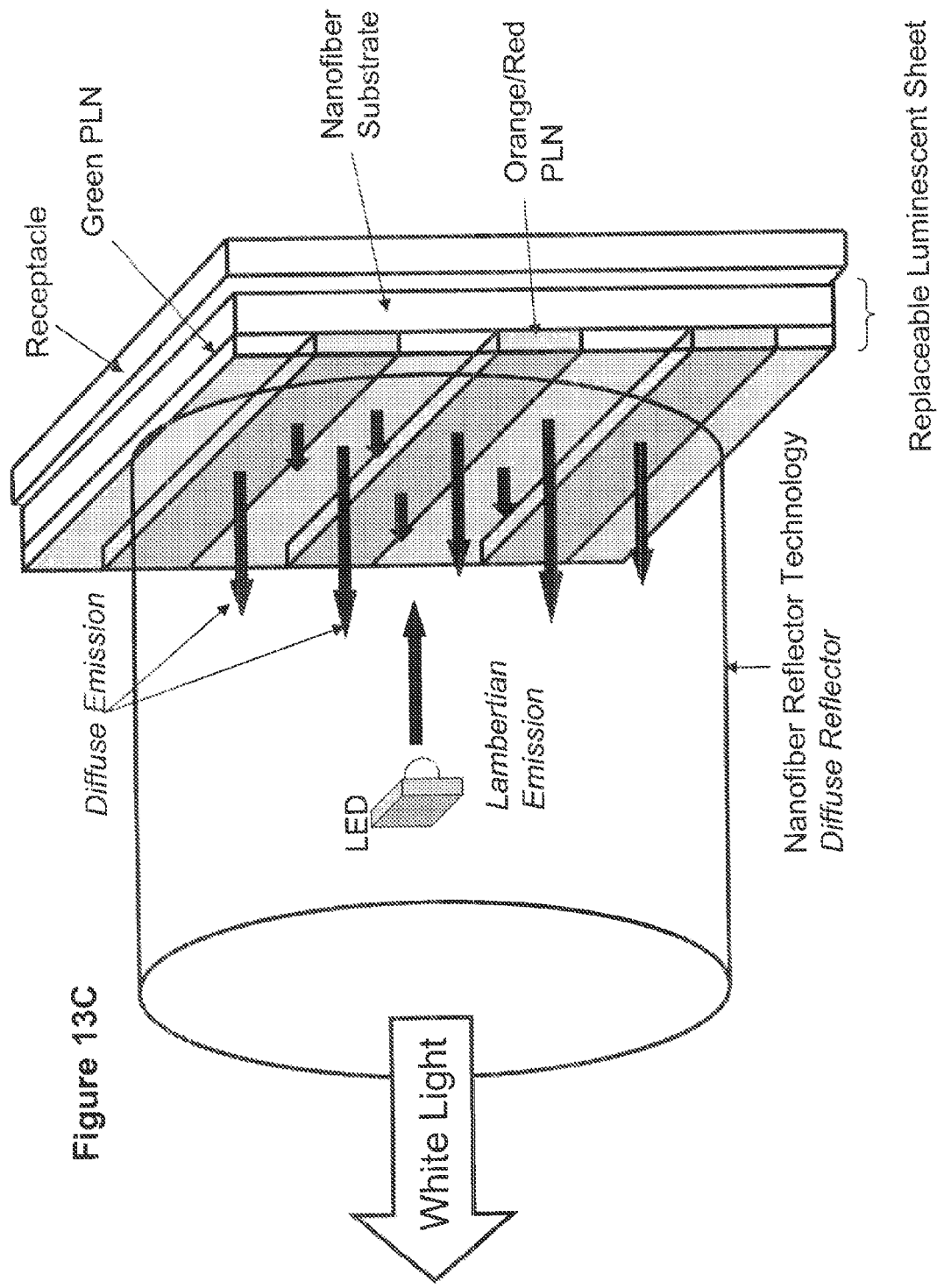
FIG. 13C is a depiction of another lighting structure according to one embodiment of the present invention.
Figure 13D:
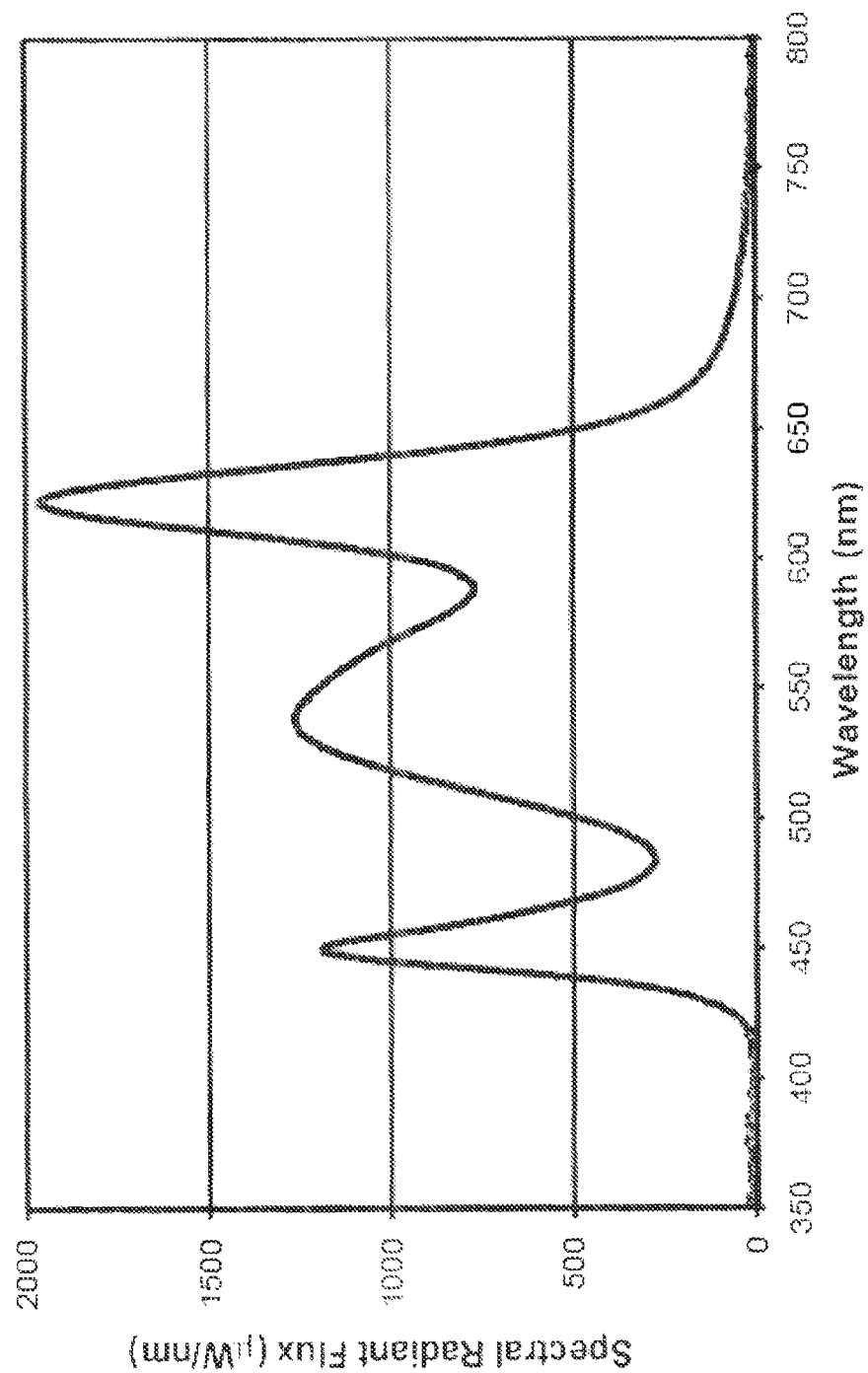
FIG. 13D depicts the optical spectra from a photoluminescent nanofiber created by coating a nylon nanofiber with a green phosphor and red-orange quantum dots, inserted into the embodiment depicted in FIG. 13C of the present invention and tested using a blue LED as the excitation source.

FIG. 13C is a schematic depiction of a luminaire made according to another embodiment of this invention. In this embodiment, the luminescent sheet is housed at the back of a reflective cavity formed by a diffuse reflector such as nanofibers. A LED is provided on the interior of the cavity and is directed at the luminescent sheet. The LED may provide oblique illumination of the luminescent sheet or could provide normal (i.e., perpendicular) illumination if highly collimated. The luminescent sheet is fabricated according to the Examples given above and the nanofiber base of the luminescent sheet is sufficiently thick that at least a portion of the primary radiation emitted by an LED is reflected from the luminescent sheet. When energized, the LED produces blue light, at least a portion of which is directed at the luminescent sheet. The green and red luminescent particles associated with the luminescent sheet will emit secondary radiation that can combine with unconverted blue radiation to produce white light of excellent color rendering properties. An example of a spectral power distribution obtained with a particular prototype of this embodiment of the invention is provided in FIG. 13D. This prototype light source produced light having a correlated color temperature (CCT) of 3,900 K, a color rendering index (CRI) of 92, and a color quality scale (CQS) of 91. The measured luminous efficacy of this light source exceeded 55 lumens per watt at an LED operational current of 200 mA. These values are excellent quantities for a light source.

Alternative, the embodiment shown in FIG. 13C can be modified to operate with a cool white LED source with a CCT value above 5,000 K and the luminescent sheet would only require red-orange quantum dots. In this embodiment, the light source is vastly improved over that of the cool white LED. The CCT of a particular prototype of this improved light source was measured to decrease to values as low as 2,700 K producing a more pleasing warm white color that results in less glare. The color rendering properties of this light source also increased and the improved CRI values rose to 0.90. The luminous efficacy of this light source was roughly 46 lumens per Watt, which greatly exceeds the efficiency of traditional incandescent illumination sources.

Alternatively, the embodiment shown in FIG. 13C can be constructed to contain two identical halves with one half containing a luminescent sheet providing green radiation when activated by a LED and the second half containing a luminescent sheet providing red radiation when activated by a LED. A reflector may be used to separate the two halves. The output from these two halves can be optically combined using an integrating sphere or other optically mixing element to produce white light. In addition, the power supplied to each LED can be adjusted to provide a mix of green, red, and blue light to provide a light source with colors other than white.

Figure 13F:
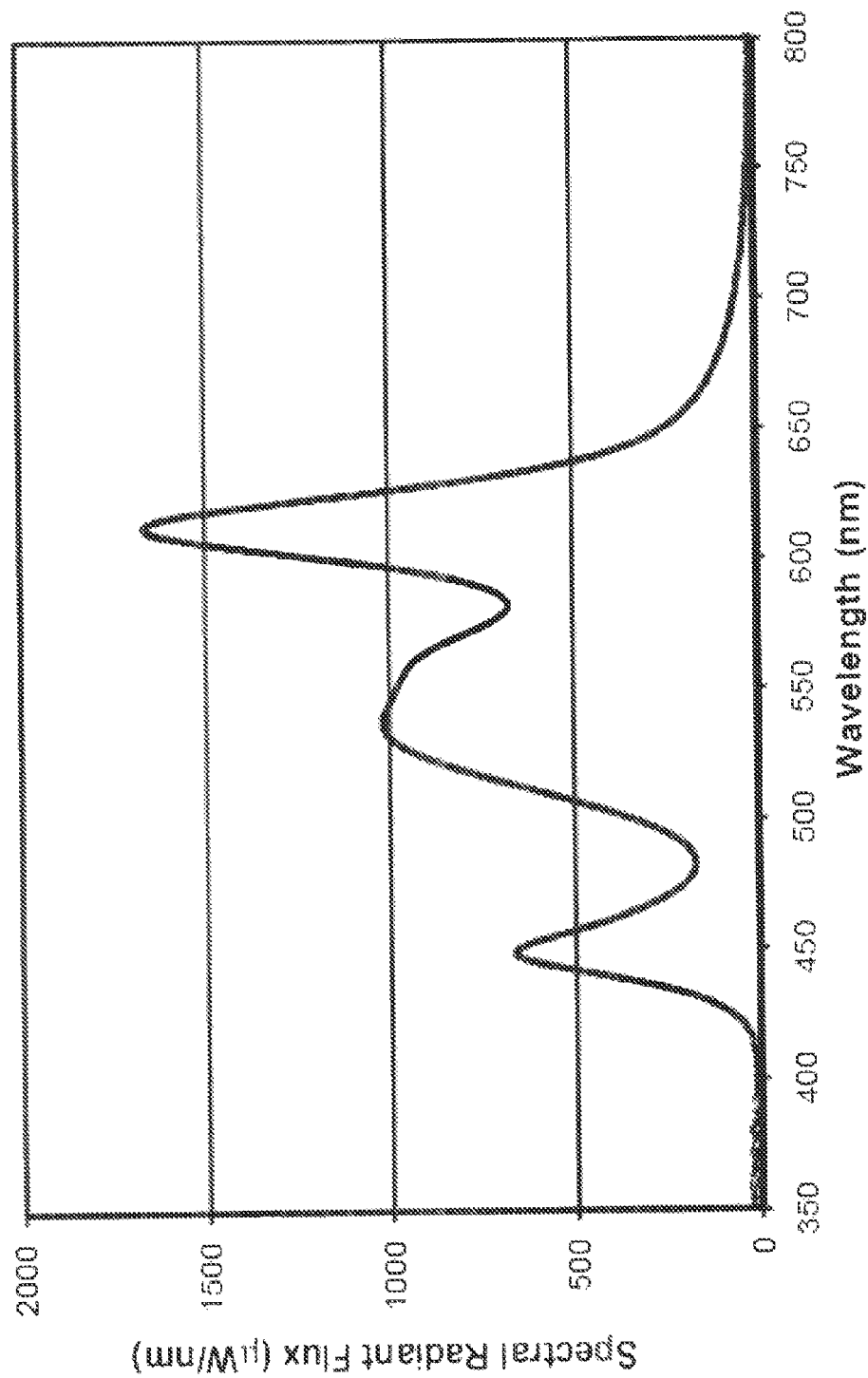
FIG. 13F depicts the optical spectra from a photoluminescent nanofiber created by coating a nylon nanofiber with a green phosphor and red-orange quantum dots, inserted into the embodiment depicted in FIG. 13E of the present invention and tested using a blue LED as the excitation source.

FIG. 13E is a schematic depiction of a luminaire made according to another embodiment of this invention. In this embodiment, the luminescent sheet is housed at the back of a reflective cavity formed by a diffuse reflector such as nanofibers. A LED is mounted on the exterior of the cavity and is directed at the luminescent sheet. The LED may provide oblique illumination of the luminescent sheet or could provide normal (i.e., perpendicular) illumination if highly collimated. The luminescent sheet is fabricated according to the Examples given above and the nanofiber base of the luminescent sheet is sufficiently thick that at least a portion of the primary radiation emitted by an LED is reflected from the luminescent sheet. When energized, the LED produces blue light that is directed at the luminescent sheet. The green and red luminescent particles associated with the luminescent sheet will emit secondary radiation that can combine with unconverted blue radiation to produce white light of excellent color rendering properties. An example of a spectral power distribution obtained with a particular prototype of this embodiment of the invention is provided in FIG. 13F, FIG. 13F depicts the optical spectra from a photoluminescent nanofiber created by coating a nylon nanofiber with a green phosphor and red-orange quantum dots, inserted into the embodiment depicted in FIG. 13E of the present invention and tested using a blue LED as the excitation source. This light source produced light having a correlated color temperature (CCT) of 3,600 K, a color rendering index (CRI) of 85. These values are excellent quantities for a light source.

Alternatively, the embodiment shown in FIG. 13E can be constructed to contain two identical halves with one half containing a luminescent sheet providing green radiation when activated by a LED and the second half containing a luminescent sheet providing red radiation when activated by a LED. A reflector may be used to separate the two halves. The output from these two halves can be optically combined using an integrating sphere or other optically mixing element to produce white light. In addition, the power supplied to each LED can be adjusted to provide a mix of green, red, and blue light to provide a light source with colors other than white.

Optically Thin Luminescent Sheets:

In this embodiment of the present invention, the light-conversion material is thin or otherwise relatively transparent. In such a situation, almost all if not all parts of the light-conversion material will have an opportunity to interact with the incident excitation illumination. If the light-conversion material is in the form of a thin sheet, the transparency of the sheet means that emitted light 112 will exit from both faces of the sheet even though only one side is illuminated by the excitation light. Because some excitation illumination will pass through the light-conversion material without interacting, in this embodiment, the excitation light 110 is reflected back toward sheet to produce multiple passes for interaction or light scattering.

As before, illumination from the excitation light source does not directly escape the lighting device. In one embodiment of the present invention, any light escaping the lighting device includes both 1) a component of the excitation light has been scattered from a matrix of the luminescent sheets without a change in wavelength (for example, blue light) and 2) emitted light produced by active luminescent particles (for example light having a longer wavelength than the excitation light (for example, yellow light).

Figures 14A, 14B:
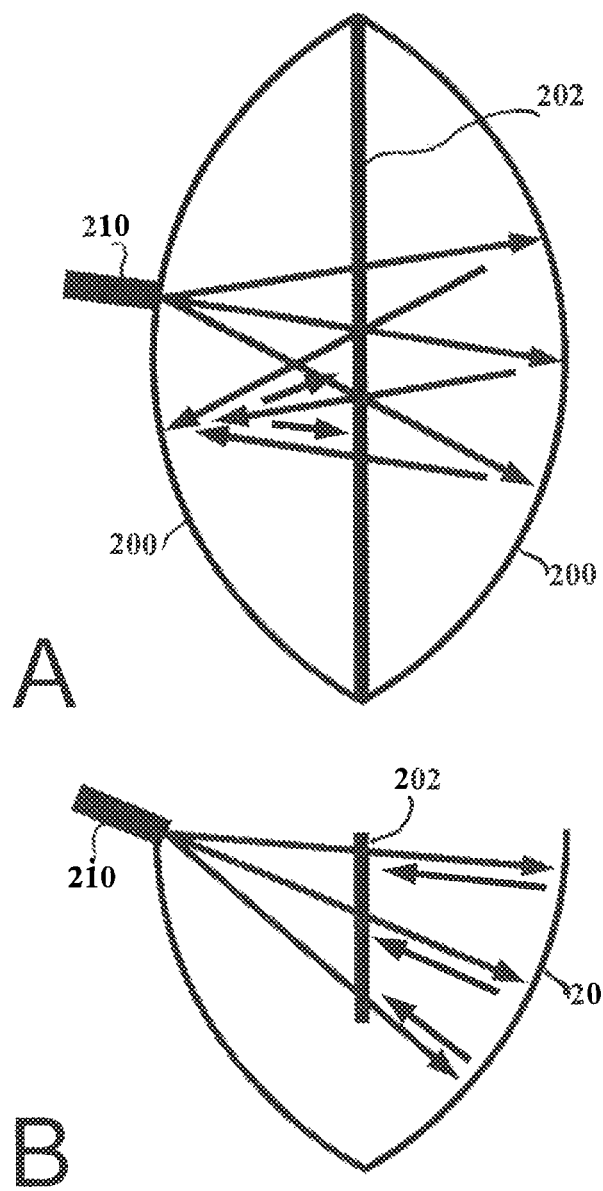
FIG. 14 is a depiction of a light emitting structure according to one embodiment of the present invention, from different perspective views.
Figure 14C:
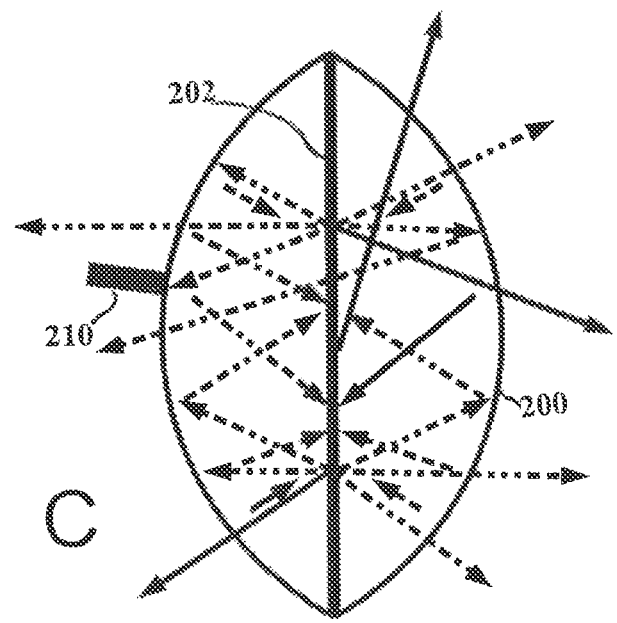
Figure 14D:
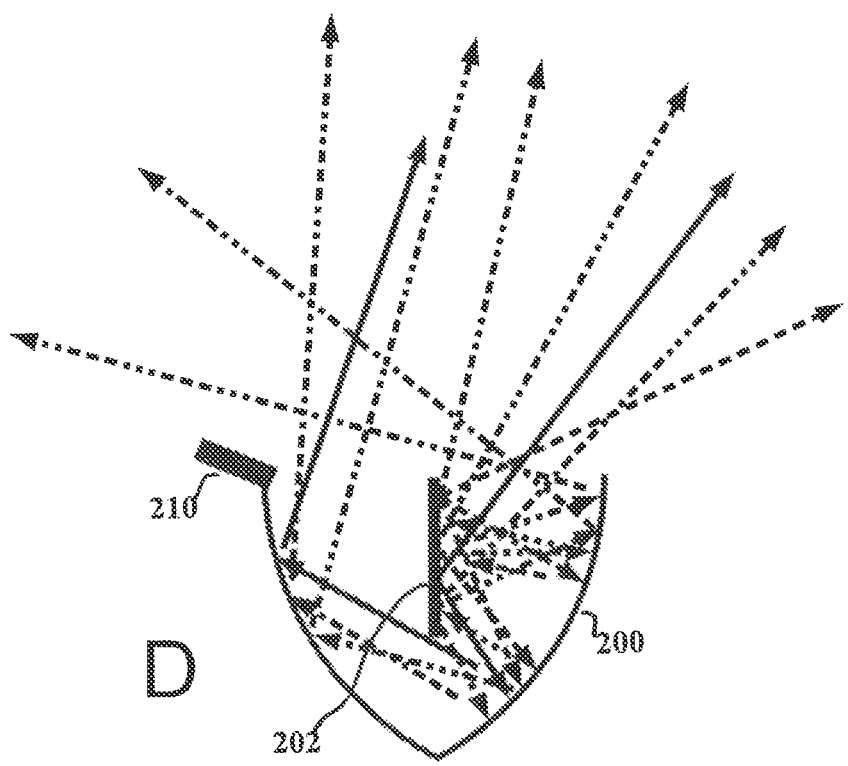

Based on the considerations above, one kind of light emitting structure for an efficient lighting device has been designed (FIG. 14). FIG. 14 is a depiction of a light emitting structure according to one embodiment of the present invention, from different perspective views. FIG. 14A shows a top view of a structure 200 whose periphery includes segments of a circle. A light source 210 such as for example an LED provides excitation illumination for the light-conversion material 202, located in this embodiment in the center of structure 200. Excitation light, indicated by solid arrows, is transmitted through the light-conversion material 202 and reflected by the structure 200. FIG. 14B is a side view of the reflector 200, showing in the side view an outline including segments of a circle. The solid arrows indicate unscattered excitation light. FIG. 14C is a top view of structure 200, showing the emission and scattering of light from the light-conversion material 202. Excitation light incident onto the luminescent sheet is not shown. Excitation light scattered from the matrix of the luminescent sheet without change of wavelength is indicated by solid arrows. Secondarily emitted light, having one or more wavelengths that are longer than that of the excitation light, is indicated by dashed arrows. FIG. 14D shows a side view of structure 200. While FIG. 14 B illustrates unscattered excitation light, FIG. 14D illustrates scattered excitation light (indicated by solid arrows) and secondarily emitted light (dashed arrows). Depending on the composition of the luminescent material, the secondarily emitted light may have one wavelength or several wavelengths. In this part of structure 200, only light emitted from the right side of the light-conversion material 202 is shown, in order to illustrate more clearly the additional path for reflection of light underneath the light-conversion material.

By placing the light source 210 near the center of a section of a sphere, the excitation light is reflected back toward the source 210, maximizing the amount of transmitted light that is reflected back through the light-conversion material 202. To minimize self-absorption of light in the body of the light source 210, an exit face of for example an LED can be located slightly to one side of the center of the circular section that describes the opposite side of the reflector (FIG. 14A). Such an arrangement preferentially directs the transmitted excitation toward the polished part of the reflector.

Figures 15A, 15B:
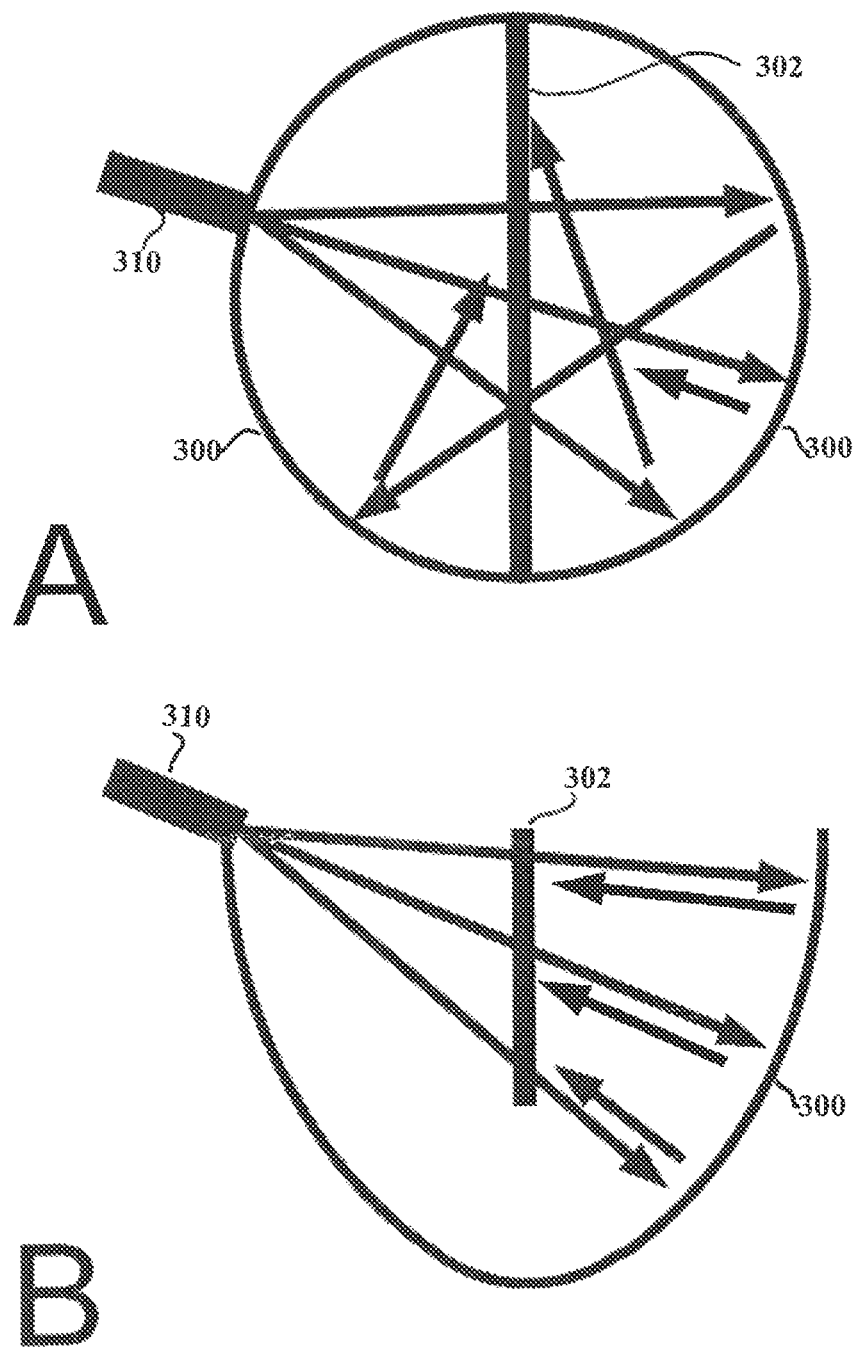
FIG. 15 is a depiction of another light emitting structure according to one embodiment of the present invention, from different perspective views.
Figures 15C, 15D:
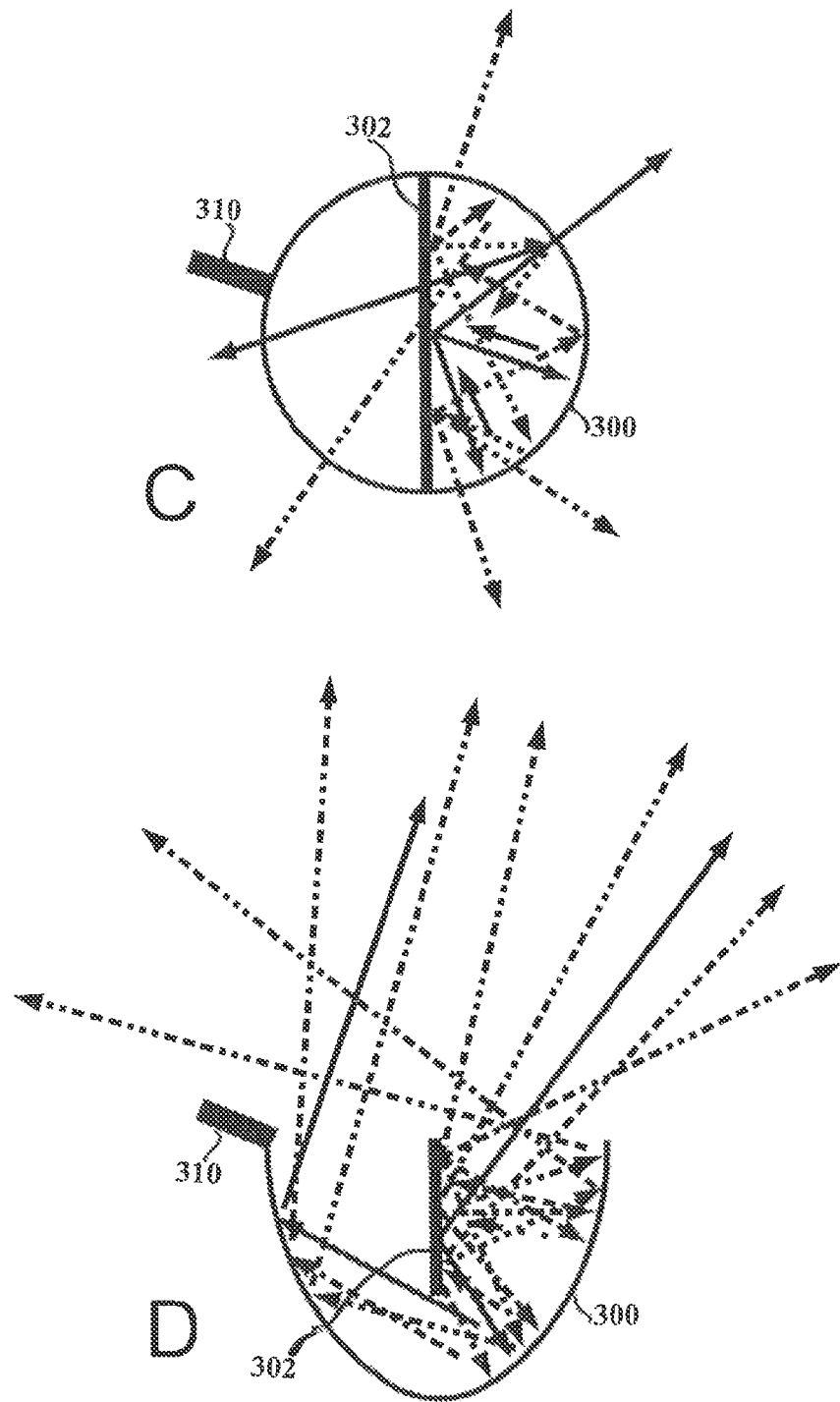

FIG. 15 is a depiction of another light emitting structure 300 according to one embodiment of the present invention, from different perspective views. FIG. 15A shows a top view of structure 300 whose outline includes segments of a full circle. A light source 310 such as for example an LED provides excitation illumination for the light-conversion material 302, located in this embodiment in the center of structure 300. Excitation light is transmitted through the light-conversion material 302 and reflected by the structure 300. Unscattered excitation light is indicated by solid arrows. FIG. 15B is a side view of the structure 300, also showing an outline including segments of a circle. FIG. 15C is a top view of structure 300, showing the emission and scattering of light from the light-conversion material 302. Excitation light incident onto the luminescent sheet is not shown. Excitation light scattered from the matrix of the luminescent sheet without change of wavelength is indicated by solid arrows. Secondarily emitted light, having one or more wavelengths that are longer than that of the excitation light, is indicated by dashed arrows. While FIG. 15 B illustrates unscattered excitation light, FIG. 15D illustrates scattered excitation light (indicated by solid arrows) and secondarily emitted light (dashed arrows). Depending on the composition of the luminescent material, the secondarily emitted light may have one wavelength or several wavelengths. In this part of structure 300, only light emitted from the right side of the light-conversion material 302 is shown, in order to illustrate more clearly the additional path for reflection of light underneath the light-conversion material 302.

Because the fabrication of the reflector shown in FIG. 14 is relatively complex, a reflector shaped like the one in FIG. 15 offers some advantage in terms of its construction. In this embodiment, the outline of the top view of structure 300 is a full circle, and the light source 310 is not located at its center. In this configuration, some light is still scattered back toward the light-conversion material 302 and the opposite reflector surface. In the perpendicular plane (FIG. 15B), the light source 310 is in the center of the circle forming part of the side of structure 300, which is intended to optimize reflection back toward the light conversion material.

Figure 16:
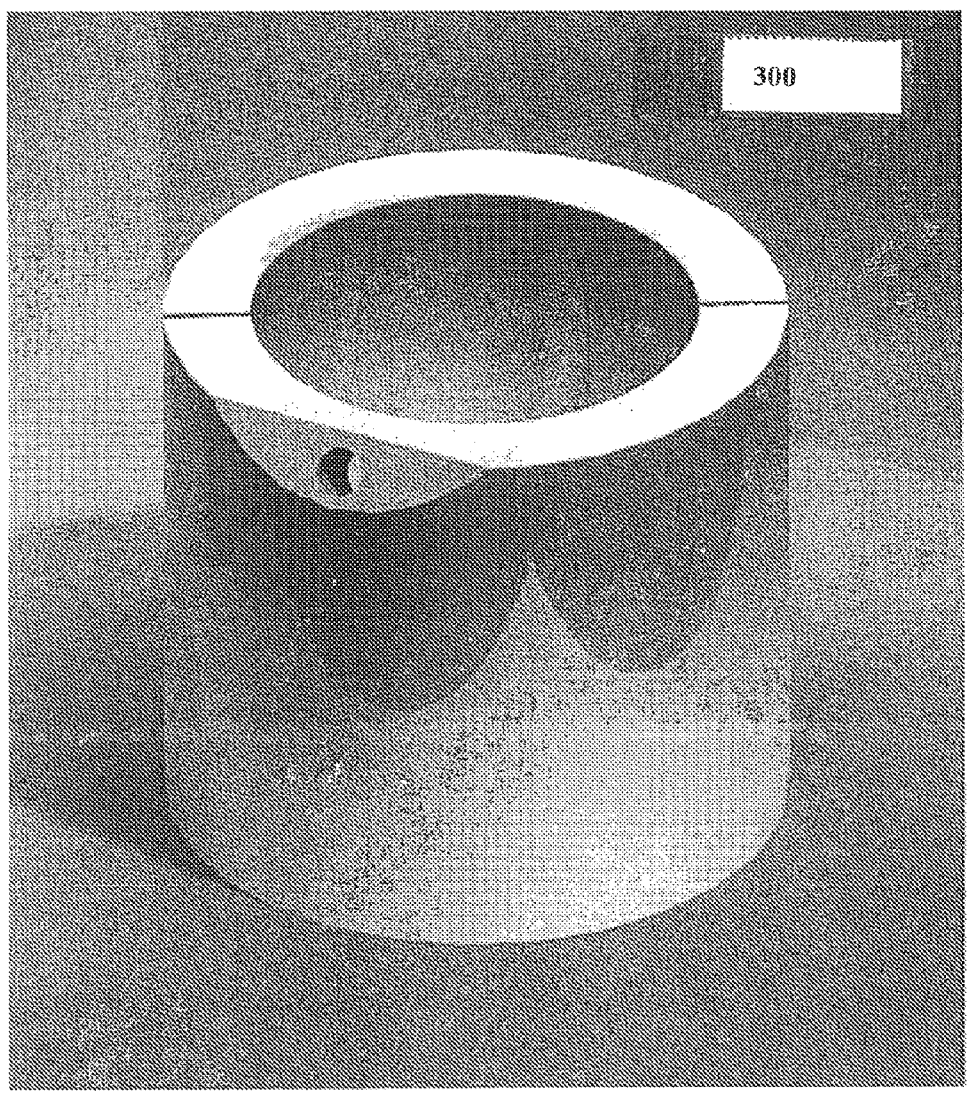
FIG. 16 is a computer generated three-dimensional depiction of the reflector in FIG. 15.

A model of reflector 300 is shown in FIG. 16. The hole in the upper front rim is configured to hold a LED for producing the excitation light. The slot on the top surface is configured to hold the light-conversion material 302.

Figure 17:
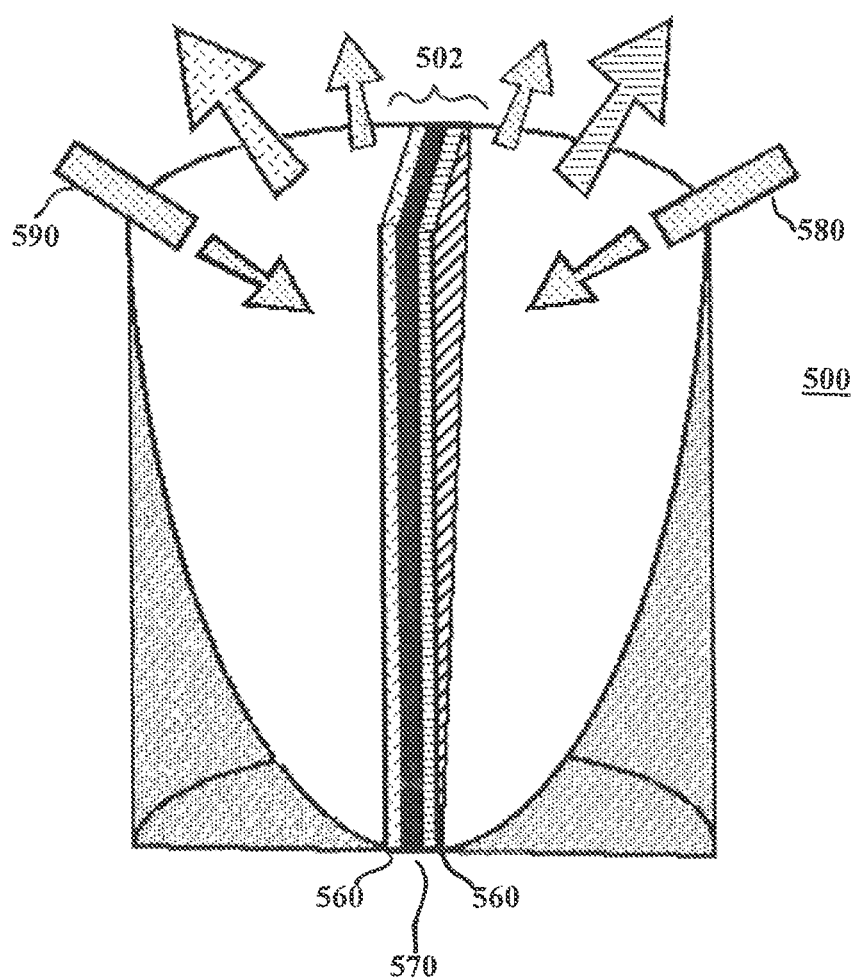
FIG. 17 is a depiction of another light emitting structure according to one embodiment of the present invention.

Remote Phosphor Reflector Block:

A remote phosphor reflector block (RPRB) embodiment of the present invention provides another mechanism for incorporating the light conversion materials discussed above. FIG. 17 is a depiction of a RPRB according to one embodiment of the present invention.

In the RPRB embodiment, light-conversion material 502 is relatively thick or otherwise substantially diffusely reflective. Such a reflective conversion material does not permit substantial light to be transmitted through light-conversion material 502. Therefore, this material provides a mechanism to separate light of different colors in different compartments. Separation of colors of light is a benefit when mixed light converters are to be used. For example, light emitting structure 500 can include both a green converter layer 550 and a red converter layer 560 which both can interact with blue excitation light. Mixed converters 550, 560 (e.g., green and red) can be arranged to provide a wider color gamut or better color rendering quality than a single converter layer (such as for example a single yellow layer). In this regard, mixed converters can be advantageous. However, with mixed converters, it may happen that blue light is intercepted by a green converter, which emits green light, and the emitted green light can in turn be intercepted by a red converter which emits red light. Multiple conversions like this reduce the efficiency of light production. Efficiency in this context also referring to the ratio of the amount of light produced by the luminaire (integrated over all directions, for example in an integrating sphere) to the power used to operate the luminaire. It should be noted that, for the same power input to the structure 500, multiple conversions of light colors produce less total light than single conversions. To address this inefficiency, this embodiment of the present invention segregates areas of different color conversion layers into different regions using reflective barriers 570.

As before, for a balance of white light, illumination from the excitation light source should not directly escape the RPRB luminaire structure. Light escaping the luminaire structure should include excitation light scattered from the matrix of the light-conversion material without a change in wavelength (for example, blue light) combined with emitted light produced by the active luminescent particles that has a longer wavelength than the excitation light (for e.g., example, red and green light).

In the RPRB embodiment, a concave reflector holds an array of converting and reflective layers in a position parallel to the axis of the reflector. The converting layers (e.g., 550 and 560) are located in a position that divides the volume of the reflector into two volumes. The structure 500 includes two light sources (e.g., two LEDs or other light sources) to supply respectively excitation light (in this example, blue light) to the converting layers 550 and 560. The central layer in FIG. 17 is a plane reflector for example made of polished aluminum foil (or other suitable reflector of light). Alternatively, a diffuse reflector can be created by coating the polished Al with a high reflectance material such as nanofibers or $BaSO_4$ white reflectance coating (available from Edmund Optics). The color converting layer 550 in FIG. 17 can be for example a layer of photoluminescent nanofibers that produces green light, while color converting layer 560 can be a layer of photoluminescent nanofibers that produces red light.

More specifically, in the configuration of FIG. 17, green and red photoluminescent nanofiber sheets (PLNs) 550 and 560 are placed back to back and separated by a reflecting layer 570 such as aluminum foil or an aluminum thin film. Each PLN is pumped by its own short wavelength LED 580, 590 such as those emitting wavelengths such as 410, 450, 460 or 470 nm. Light output from each LED can be adjusted by altering the LED driving voltage. The pump light and the red and green lights are not configured to mix until exiting the reflector 500.

By combining blue light from the emission source (i.e., the primary light) and emissions from red to green PLNs (i.e., the secondary light), white light is produced. Such white light can be used as is or optically mixed to eliminate any vestiges of the separate R, G, or B lights by using devices such as an integrating sphere or high transmittance diffuser polymeric film such as those available from Brightview Technologies.

In the various embodiments described above, the light sources can be LEDs used to excite the PLNs (or color conversion layers) which may emit one primary wavelength or emit different primary wavelengths. For example, one LED could emit at 460 nm and the second could emit at 410 nm.

One advantage of the nanofiber base of the PLNs is that it represents a diffuse Lambertian reflector under certain circumstances. Thus, light incident on a diffuse reflecting nanofiber will not be specularly reflected but rather will be scattered at all angles with a cosine θ dependence with respect to the surface normal (i.e., following Lambert's emission law).

An alternative to having separate green and red PLNs, each pumped by a blue light, is to have a green PLN excited by a blue LED and in the second compartment have a red LED impinging on an undoped nanofiber substrate. This design could still be configured to emit blue, green and red light in the proper proportionality to generate white light, and the reflective layer may not be required. This approach represents a solution to the so-called "green gap" of low performing LEDs. Alternatively, green or red phosphors could be used in place of quantum dots. Alternatively, blue and red LEDs could be aimed at a green PLN to produce white light. Multiple blue or red LEDs can be added to the reflector block to impart greater control over the light produced.

In addition to the embodiments listed above, there are several additional embodiments of this invention. These embodiments include:

1) Incorporation of an optically clear encapsulant such as an epoxy or a silicone-based encapsulant available from suppliers such as General Electric or Dow Corning in at least a portion of the RPRB structure. Such encapsulants may or may not contain luminescent particles. With this embodiment, the index of refraction of these encapsulants is chosen to maintain the diffuse reflectance nature of the nanofiber component of the PLN.

2. In addition, the reflector block can be made out of reflective materials including but not limited to stamped metal, metallized plastics, and metallized glass.

3. In addition, the reflector block can be made out of diffuse reflective materials including but not limited to nanofibers, Teflon power, and $BaSO_4$ white reflectance coating applied to an outer housing.

4. The RPRB can be incorporated into a larger structure to create other lighting devices such as lamps or luminaires. For example, the RPRB could be formed in the base of a glass "Edison" bulb where a portion of the glass walls may be metallized to provide some of the functionality of the reflector block. In this embodiment, the frosted coating on the "Edison" bulb would be used as a means of mixing the red, green, and blue colors to produce white light. The electrical drivers for the RPRB "Edison" bulb could be contained in the Edisonian socket in much the same way that the ballast for compact fluorescent lights is contained at the base of the bulb.

5. In addition to incorporating luminescent nanoparticles into the PLNs as described above, other luminescent materials and phosphors can be incorporated into the PLNs. One example includes the incorporation of green phosphors such as the sulfoselenide compositions sold by PhosphorTech, as discussed above. Other examples include rare-Earth doped silicates, nitrides, and yttrium aluminum garnet phosphors sold by Internatix, as discussed above.

6. Additional optical elements such as low-pass optical filters can be added at the input port of the light source to prevent loss of the secondary emission from the photoluminescent nanofiber.

Presently, a particular prototype of the RPRB embodiment has yielded the following color rendering indexes (CRI) and correlated color temperatures (CCT). CCT values between 4,000 K and 8,200 K have been demonstrated for the RPRB structure. Correspondingly, demonstrated CRI values for the RPRB structure range from 70 to 90. Additional values of CCT and CRI are possible with the RPRB structure, without deviating from the scope of this invention, by adjusted the relative amounts of blue, green, and red light. By comparison, measured values for commercial white LEDs have a range of CCT values depending upon the color of the lamp. "Cool white" lamps have CCTS between 5,000 K and 10,000 K, "neutral white" lamps have CCTs between 3,700 K and 5,000 K, and "warm white" lamps have CCTs between 2,600 K and 3,700 K. The typical CRI of these lamps is less than 80. Higher CCTs correspond to a bluish appearance of the light source whereas lower CCTs correspond to a more reddish appearance. CRI refers to the ability to reproduce colors accurately and values above 80 are acceptable for general illumination.

Figure 18:
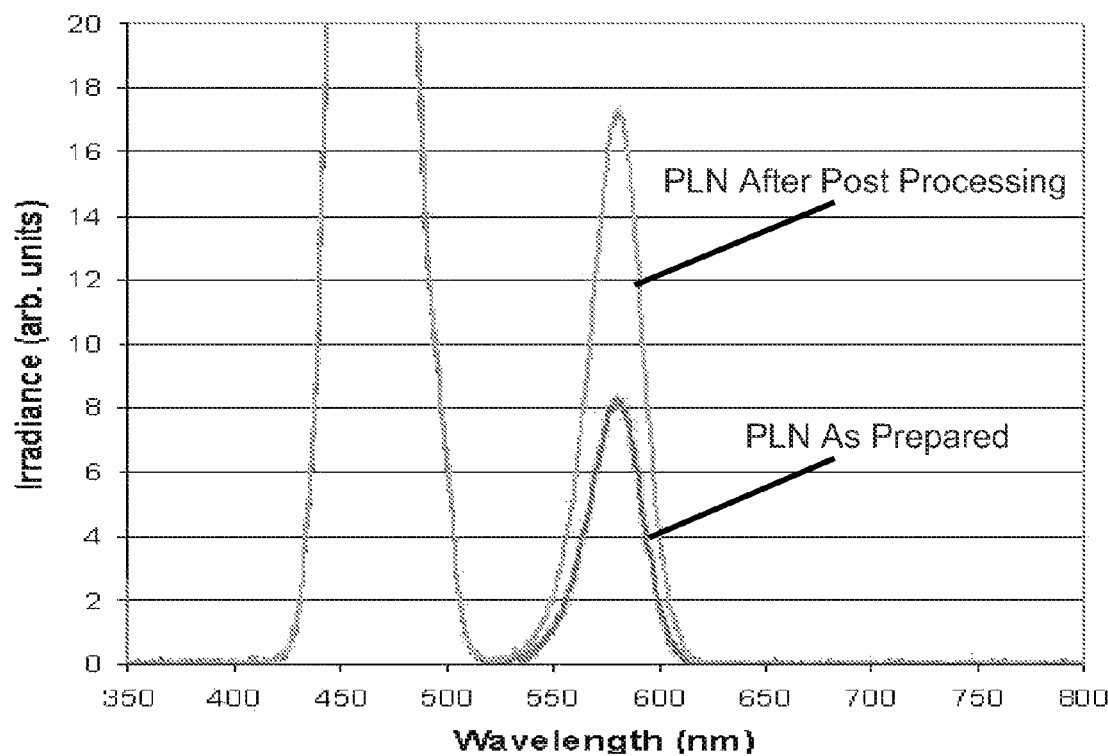
FIG. 18 is a depiction of the improvements in quantum efficiency provided in one embodiment of the invention where the photoluminescent nanodots are attached to the outside of nanofiber.

Working Examples:

FIG. 18 shows a depiction of the improvements in quantum efficiency provided in one embodiment of the invention where the photoluminescent quantum dots are attached to the outside of nanofiber, as described above in the Luminescent Devices section. The resulting photoluminescent nanofiber structure was then treated with actinic radiation for a period between 1 and 48 hours. The actinic radiation is typically provided in the wavelength range of 350 to 490 nm at optical power levels between 0.5 $\mu W/cm^2$ and 10 $mW/cm^2$. This treatment effect was unexpectedly found to produce an increase in the quantum efficiency of photoluminescent nanofibers containing quantum dots. FIG. 18 shows specifically a doubling in efficiency. Further, testing has shown that quantum efficiencies of greater than 70% are achieved for photoluminescent nanofibers including a variety of light stimulatable particles including quantum dots and phosphors.

Figure 19:
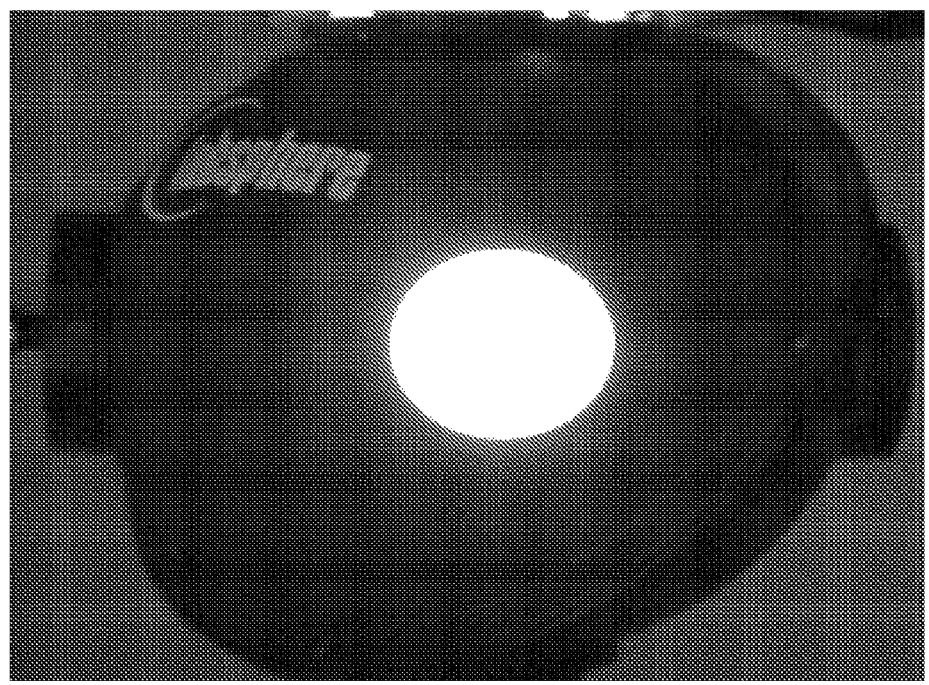
FIG. 19 is a photograph of an integrating sphere emitting light created by a luminaire according to one embodiment of this invention.

FIG. 19 below shows an optical photograph of the RPRB structure emitting white light. In this example, a blue LED emitting at 460 nm was used to excite a luminescent layer stack including a green phosphor and a PMMA nanofiber. To achieve the desired white light color, red-orange emissions from an LED was added through the RPRB structure. An integrating sphere (as discussed above) was used in this example to mix the primary and secondary light emanating from the RPRB structure to produce the resulting white light.

Figure 20:
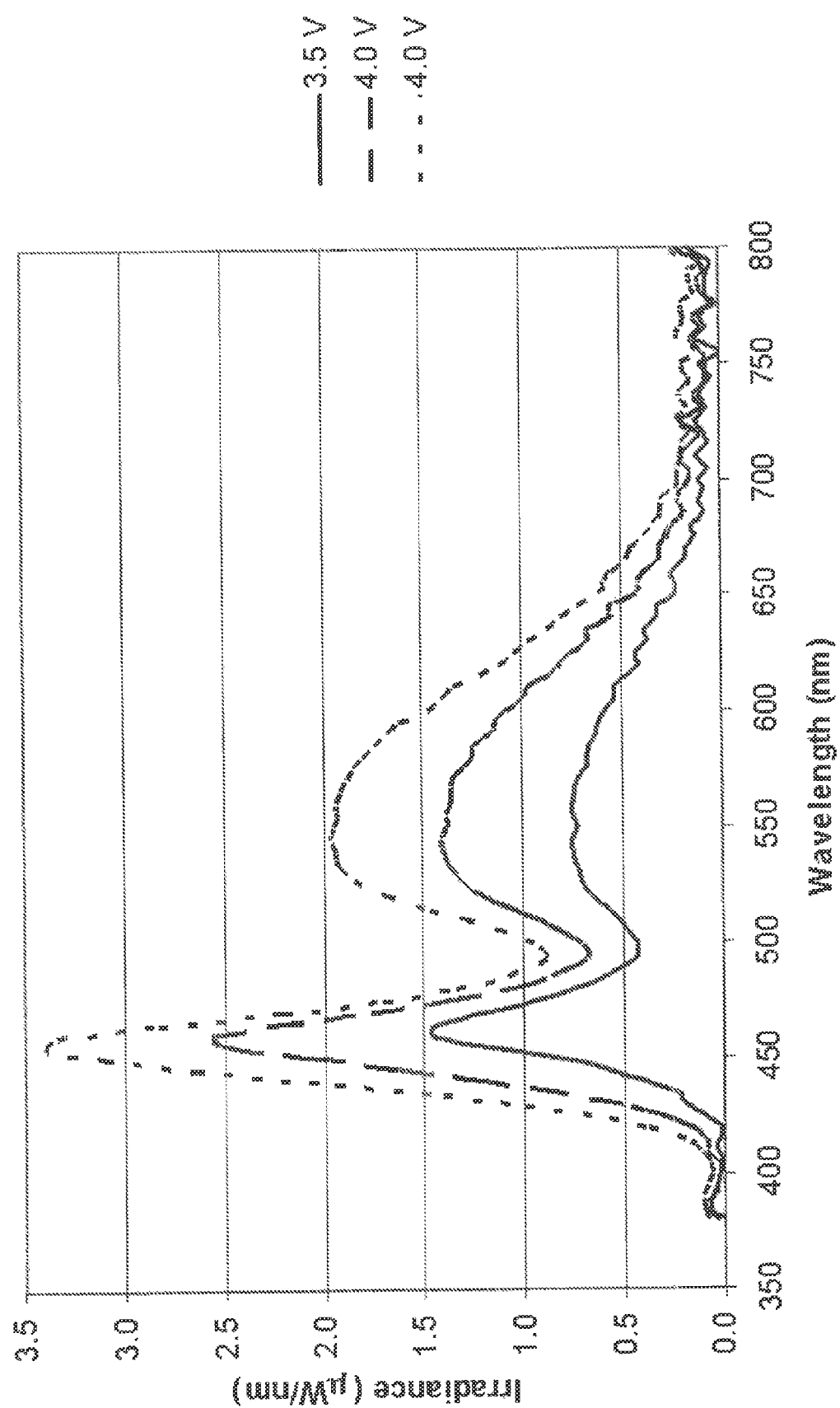
FIG. 20 depicts optical spectra from YAG:Ce screen-printed on glass slides, inserted into the RPRB structure of the present invention and tested.

FIG. 20 shows optical spectra from a YAG:Ce screen-printed on a glass slide, inserted into the RPRB structure and tested. Performance here is similar to many commercial "cool white" LEDs. The different traces represent different power levels applied from the blue light LEDs used here to excite the conversion to lower wavelengths, resulting in the mixing of blue light with the other primary colors to produce white light. The color rendering index (CRI) for the YAG:Ce screen-prints were around 80.

Figure 21:
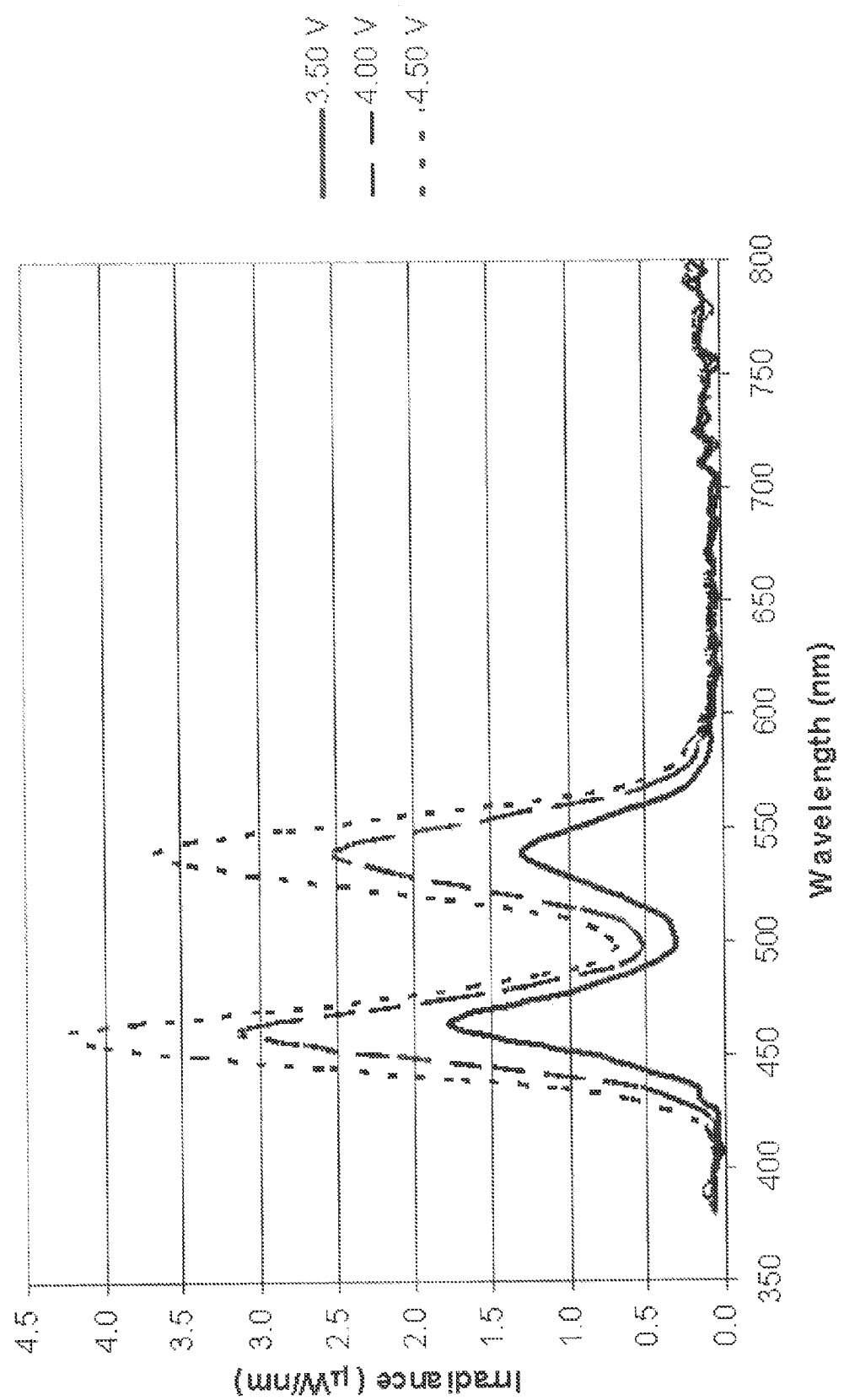
FIG. 21 depicts optical spectra from a hexane solution of green emitting quantum dots, inserted into the RPRB structure of the present invention and tested.

FIG. 21 shows optical spectra from a hexane solution of green emitting quantum dots (obtained from Evident Technology), identified here as "formula 1." Performance here is distinct from that shown in FIG. 20 for "cool white" light; primarily, the emission peak is narrower. The different traces represent different power levels applied from the blue light LEDs used here to excite the conversion to lower wavelengths, resulting in the mixing of blue light with the other primary colors to produce white light. This solution was used to coat a PMMA nanofiber, and spectra comparable to that of FIG. 21 were obtained. When red-orange light was introducing through the second light source aperture on the RPRB, the resulting photoluminescent nanofiber structure exhibited CRIs between 40 and 90 and CCTs between 3,000 K and 8,000 K.

Figure 22:
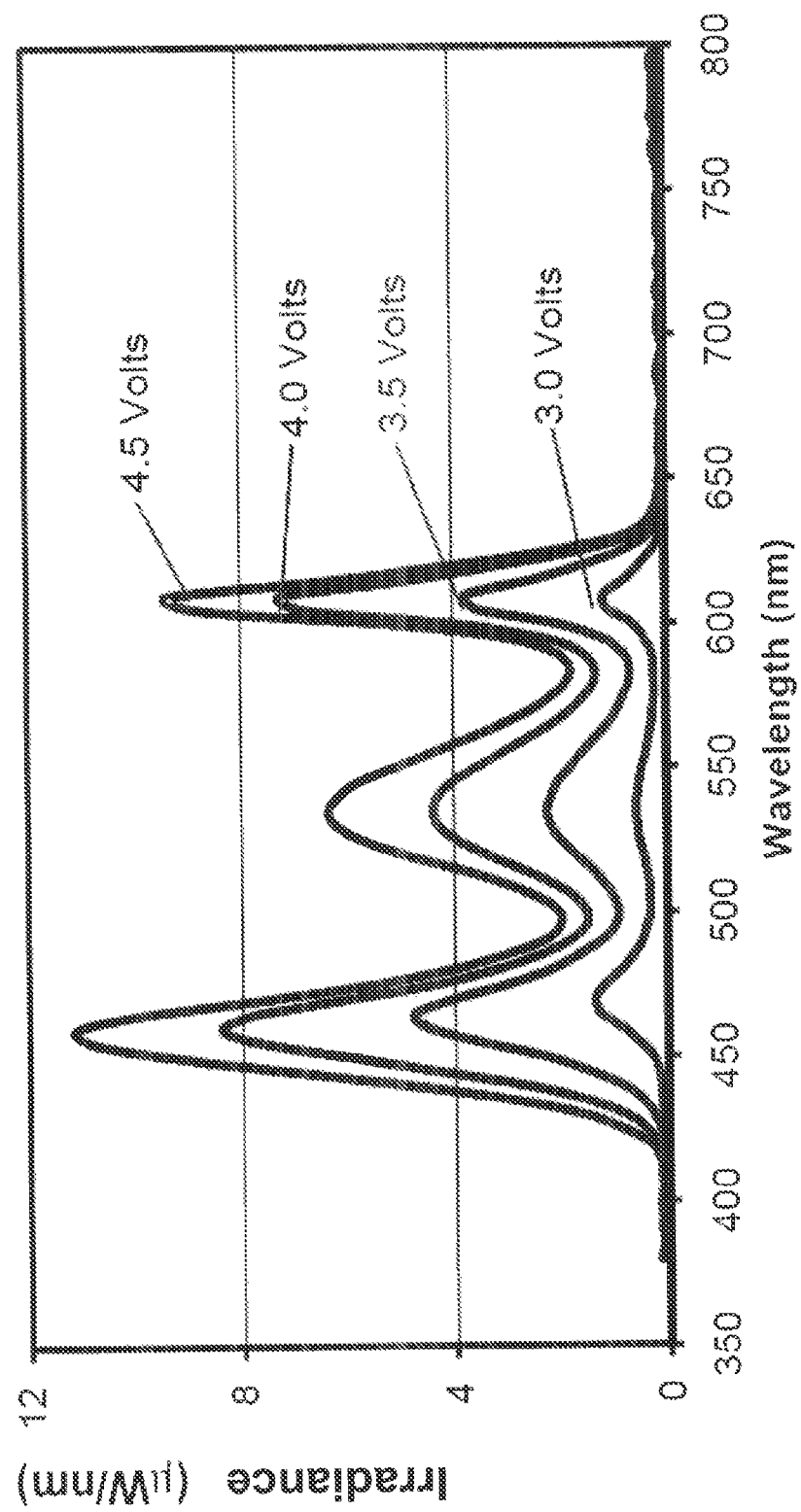
FIG. 22 depicts a cool white optical spectra from a photoluminescent nanofiber created by coating a PMMA nanofiber with a green phosphor, inserted into the RPRB structure of the present invention and tested.
Figure 23:
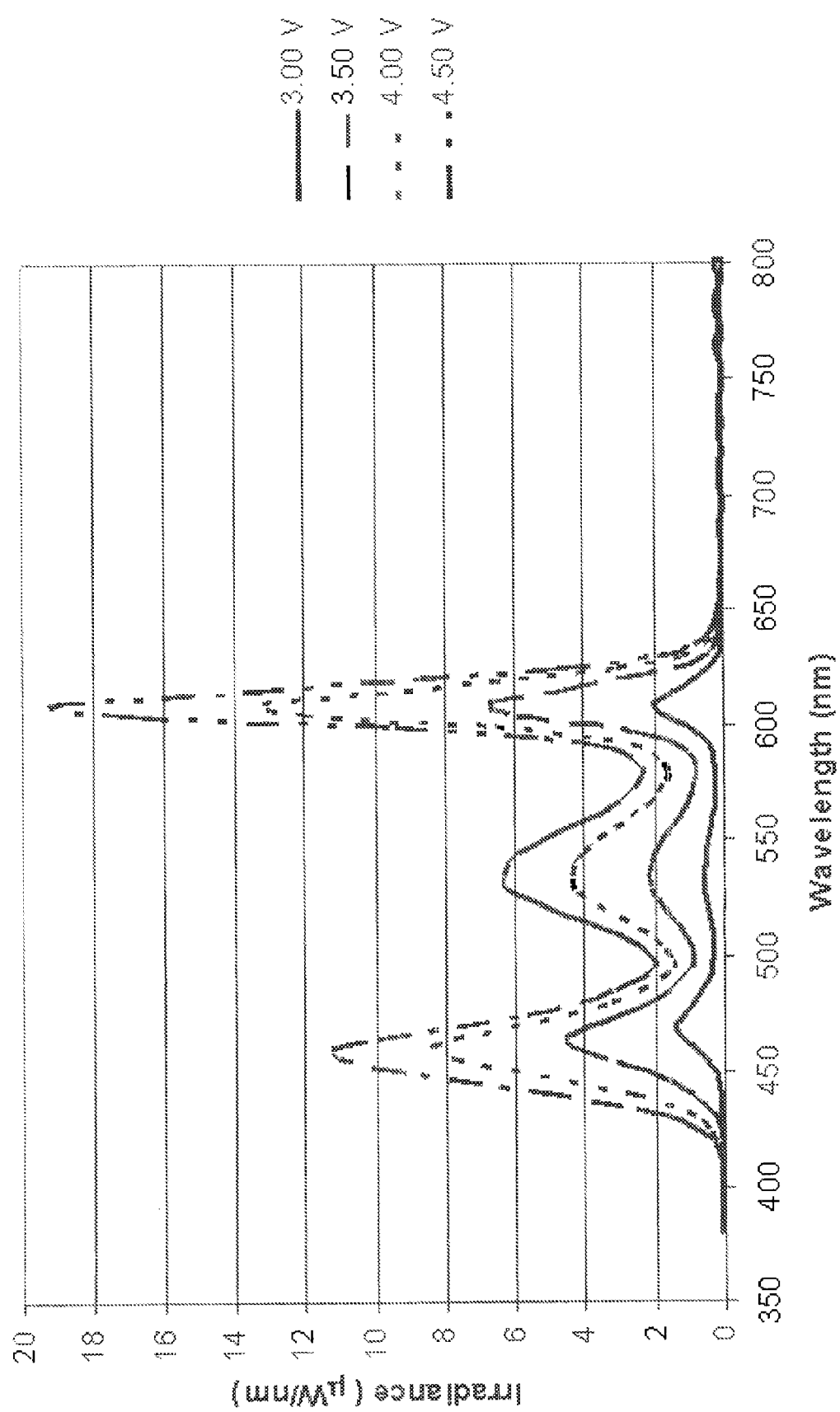
FIG. 23 depicts a neutral white optical spectra from a photoluminescent nanofiber created by coating a PMMA nanofiber with a green phosphor, inserted into the RPRB structure of the present invention and tested.

FIGS. 22-23 show optical spectra from a photoluminescent nanofiber created by coating a PMMA nanofiber with a green phosphor. The luminescent materials producing the results in FIGS. 22-23 were both the same combination of luminescent materials which included a sulfoselenide phosphor that emits green radiation. The level of red-orange lighting introduced through the RPRB structure was different, with the setting in FIG. 22 being chosen to produce a "cool white" light while that in FIG. 23 were chosen to produce a "neutral white" light." The different traces within FIGS. 22 and 23 represent different power levels applied from the blue light LEDs used here to excite the conversion to longer wavelengths, resulting in the mixing of blue light with the other primary colors to produce white light. In FIG. 22, which represents a "cool white" light produced with the RPRB structure, CCTs between 6652 K and 9044 K were produce and the CRI levels were 76 to 91. In FIG. 23, which represents a "neutral white" lighting produced with the RPRB structure, CCTs between 4200 K and 4672 K were produced and the CRI levels were between 65 and 78. Additional formulations are possible with the present invention, which can produce higher CRI values in "neutral white" and "warm white" lighting. For example, adjusting the materials and LED setting in the RPRB, a high CRI neutral white can be produced from this formulation by adjusting the relative intensities of the blue:green:red emissions to approximately 1:1:2.2. This lighting device will have a CCT and CRI of approximately 4,500 K and 88, respectively. Further adjustment of the blue:green:red ratios can be used to achieve high "Warm White" formulations. For example, adjusting the relative intensity ratios of the materials used above to approximately 1:2:6 (blue:green:red) will produce a warm white light source with a CCT of 3,250 K and a CRI of 84.

Replaceable Luminescent Elements

As noted above, in an integrated luminescent lighting device, replacement of the luminescent material can be complicated, expensive, inconvenient, and potentially prohibited by the design. In one embodiment of the invention, the luminescent sheets described above are detachable sheets such that the luminescent element in the lighting device can be readily exchanged. For example, in one embodiment of the invention, the nanofiber substrate shown in FIG. 13C and the luminescent sheet shown in FIG. 13E are exchange-able (i.e., replace-able) by detaching these elements from the reflecting structures shown in those drawings. For example, in another embodiment of the invention, the luminescent sheet elements 202 and 302 in FIGS. 14A and 15A, respectively, can be taken in and out of a receptacle holding the luminescent sheet in position inside the reflector structures. For example, in another embodiment of the invention, the luminescent sheet element 502 in FIG. 17, respectively, can be a replaceable luminescent sheet.

Numerous modifications and variations of the present invention are possible in light of the above teachings. It is therefore to be understood that within the scope of the appended claims, the invention may be practiced otherwise than as specifically described herein.

The invention claimed is:

1. A stimulated lighting device comprising:
a luminescent sheet extending along a longitudinal axis toward a light exit of the device and including light stimulatable particles configured to emit secondary light upon receiving primary light;
a source offset from the longitudinal axis and configured to generate and direct said primary light onto the luminescent sheet;
at least one reflector disposed apart from the luminescent sheet and configured to reflect at least a part of the primary light and a part of the secondary light onto the luminescent sheet and configured to reflect at least a part of scattered primary light and a part of the secondary light from the luminescent sheet toward the light exit; and
said light exit configured to emanate light from the lighting device as a combination of the primary light and the secondary light.

2. The device of claim 1, wherein the part of the secondary light reflected onto the luminescent sheet comprises substantially no reflected light.

3. The device of claim 1, wherein the light emanated from the light exit has a color rendering index greater than 70.

4. The device of claim 1, wherein:
the at least one reflector comprises a reflector disposed on one side of the luminescent sheet; and
the luminescent sheet has a transmittance of less than 40% for the primary light.

5. The device of claim 1, wherein:
the at least one reflector comprises opposite reflectors disposed on opposite sides of the luminescent sheet; and
the luminescent sheet has a transmittance of less than 40% for the primary light.

6. The device of claim 5, wherein the opposite reflectors comprise at least one of planar or curved reflectors.

7. The device of claim 5, wherein the opposite reflectors comprise spherical or cylindrical reflectors.

8. The device of claim 5, wherein the light source comprises at least two light sources disposed respectively on opposite sides of the luminescent sheet.

9. The device of claim 1, wherein:
the at least one reflector comprises opposite reflectors disposed on opposite sides of the luminescent sheet;
the luminescent sheet has a transmittance of greater than 40% for the primary light; and
the light source comprises a light source disposed in a position to illuminate directly only one side of the luminescent sheet.

10. The device of claim 8, wherein the opposite reflectors comprise at least one of planar or curved reflectors.

11. The device of claim 9, wherein the opposite reflectors comprise spherical or cylindrical reflectors.

12. The device of claim 9, wherein the light source is disposed in a wall of one of the opposite reflectors.

13. The device of claim 1, wherein the light source comprises two light sources emitting separate wavelengths of light.

14. The device of claim 1, wherein the luminescent sheet comprises:
nanofibers; and
an optically clear encapsulant securing the nanofibers and the light stimulatable particles.

15. The device of claim 14, wherein the encapsulant has an index of refraction that differs from the material being encapsulated by at least 0.10.

16. The device of claim 1, wherein the at least one reflector comprises at least one of a stamped metal member, a metallized plastic member, nanofiber, or a metallized glass member.

17. The device of claim 1, wherein the light exit comprises a light diffusing material configured to mix the primary light and the secondary light.

18. The device of claim 17, wherein the light diffusing material comprises a frosted optical component configured to mix the primary light and the secondary light.

19. The device of claim 1, wherein the light exit comprises an integrating sphere configured to mix the primary light and the secondary light.

20. The device of claim 1, wherein the source configured to generate said primary light comprises an electrical bulb socket.

21. The device of claim 1 where the luminescent sheet includes a diffuse reflector.

22. The device of claim 1, wherein the luminescent sheet comprises nanofibers having an average fiber diameter in a range between 100 to 5,000 nm.

23. The device of claim 22, wherein the nanofibers have an average fiber diameter is in a range between 300 nm to 3,000 nm.

24. The device of claim 21, wherein the luminescent sheet has a thickness in a range between 0.01 microns and 2,000 microns.

25. The device of claim 1, wherein the luminescent sheet has a thickness in a range between 1 to 500 microns.

26. The device of claim 1, wherein the stimulatable particles comprise luminescent particles.

27. The device of claim 26, wherein the luminescent particles comprise at least one of quantum dots and phosphors.

28. The device of claim 27, wherein the quantum dots comprise at least one of silicon, germanium, indium phosphide, indium gallium phosphide, indium phosphide, cadmium sulfide, cadmium selenide, lead sulfide, copper oxide, copper selenide, gallium phosphide, mercury sulfide, mercury selenide, zirconium oxide, zinc oxide, zinc sulfide, zinc selenide, zinc silicate, titanium sulfide, titanium oxide, and tin oxide.

29. The device of claim 27, wherein the phosphors comprise at least one of a rare-earth doped metal oxide including $Y_2O_3$:Tb, $Y_2O_3$:Eu$^{3+}$, $Lu_2O_3$:Eu$^{3+}$, $CaTiO_3$:Pr$^{3+}$, CaO:Er$^{3+}$, (GdZn)O:Eu$^{3+}$, $Sr_4Al_{14}O_{25}$:Eu$^{3+}$, $GdMgB_5O_{10}$:Ce$^{3+}$:Tb$^{3+}$, $CeMgAl_{11}O_{19}$:Ce$^{3+}$:Tb$^{3+}$, $Y_2O_3$:Eu$^{3+}$, a rare-Earth doped yttrium aluminum garnet (YAG) including YAG:Ce$^{3+}$, a rare-Earth doped zirconium oxide including $ZrO_2$:Sm$^{3+}$ and $ZrO_2$:Er$^{3+}$, rare-Earth doped vanadates and phosphates including (YVO$_4$:Eu) and (La,Ce,Tb)PO$_4$, rare-Earth doped silicates, doped materials having a host matrix including one $Gd_2O_3$, $GdO_2S$, PbO, ZnO, ZnS, and ZnSe and including one of a dopant of Eu, Tb, Tm and Mn, metal-doped forms of zinc sulfide and zinc selenide including ZnS:Mn$^{2+}$ and ZnS:Cu$^+$, $Zn_{0.25}Cd_{0.75}$S:AgCl, nitrides, metal sulfides including CaS:Eu$^{2+}$, $SrGa_2S_4$:Eu and $Ca_wSr_xGa_y(S,Se)_z$:Eu and metal silicates including $Ca_3(Sc,Mg)_2Si_3O_{12}$:Ce and $(Ba,Sr)_2SiO_4$:Eu.

30. The device of claim 27, wherein the phosphors comprise at least one of rare-Earth doped YAG, rare-Earth doped ZnS, rare-Earth doped $SrGa_2S_4$, rare-Earth doped silicates, and rare-Earth doped ZnSe.

31. The device of claim 27, where the phosphor comprises a nano-phosphor.

32. The device of claim 1, wherein the luminescent sheet comprises a detachable luminescent sheet for replacement thereof.

33. The device of claim 32, further comprising a receptacle for placement of the detachable luminescent sheet in a vicinity of the at least one reflector.

34. A stimulated lighting device comprising:
  a luminescent sheet including light stimulatable particles configured to emit secondary light upon receiving primary light;
  a light source configured to generate and direct said primary light obliquely onto the luminescent sheet;
  a light exit configured to emanate light from the lighting device as a combination of the primary light and the secondary light wherein:
  at least one reflector configured to reflect at least a part of the primary light and a part of the secondary light onto the luminescent sheet and configured to reflect at least a part of scattered primary light and a part of the secondary light from the luminescent sheet toward the light exit;
  the at least one reflector comprises opposite reflectors disposed on opposite sides of the luminescent sheet;
  the light source comprises two light sources disposed on opposite sides of the luminescent sheet; and
  a reflecting layer is disposed as a central layer between two exposed sides of the luminescent sheet.

35. The device of claim 34, wherein the two reflectors comprise at least one of planar or curved reflectors.

36. The device of claim 34, wherein the two reflectors comprise spherical or cylindrical reflectors.

37. The device of claim 34, wherein the luminescent sheet comprises layers of photoluminescent materials, where respective layers are configured to produce different colors upon interaction with the primary light.

38. A stimulated lighting device comprising:
  a reflective housing;
  a luminescent sheet extending along a longitudinal axis toward a light exit of the device, disposed apart from the reflective housing, and disposed inside the reflective housing and configured to emit secondary light upon receiving primary light;
  a source offset from the longitudinal axis and configured to generate and direct said primary light onto the luminescent sheet; and
  said light exit in the reflective housing configured to emanate light from the reflective housing as a combination of the primary light and the secondary light.

39. The device of claim 38, wherein the light emanated from the light exit has a color rendering index greater than 70.

40. The device of claim 38, wherein the light emanated from the light exit has a color rendering index greater than 80.

41. The device of claim 38, wherein the luminescent sheet is disposed at a center of the reflective housing.

42. The device of claim 38, wherein the luminescent sheet extends at least part of the way to a bottom of the reflective housing opposite the light exit.

43. The device of claim 38, wherein the luminescent sheet is disposed at one end of the reflective housing.

44. The device of claim 43, wherein the luminescent sheet extends at least part of the way across one end of the reflective housing.

45. The device of claim 38, wherein:
  the luminescent sheet has a transmittance of less than 40% for the primary light; and
  the light source comprises two light sources disposed on the same side of the luminescent sheet.

46. The device of claim 38, wherein:
the luminescent sheet has a transmittance of less than 40% for the primary light; and
the light source comprises two light sources disposed on opposite sides of the luminescent sheet.

47. The device of claim 38, wherein:
the luminescent sheet has a transmittance of greater than 40% for the primary light; and
the light source comprises a light source disposed in position to illuminate directly only one side of the luminescent sheet.

48. The device of claim 38, wherein the reflective housing comprises at least one of planar or curved reflectors.

49. The device of claim 38, wherein the reflective housing comprises spherical or cylindrical reflectors.

50. The device of claim 38, wherein the luminescent sheet comprises a detachable luminescent sheet for replacement thereof.

51. The device of claim 50, further comprising a receptacle for placement of the detachable luminescent sheet in a vicinity of the at least one reflector.

52. A stimulated lighting device comprising:
a reflective housing;
a luminescent sheet disposed in the reflective housing and configured to emit secondary light upon receiving primary light;
a source configured to generate and direct said primary light obliquely onto the luminescent sheet;
a light exit in the reflective housing configured to emanate light from the reflective housing as a combination of the primary light and the secondary light; and
a reflecting layer disposed as a central layer between two exposed sides of the luminescent sheet.

53. A method of treating a luminescent sheet to increase a quantum emission efficiency of the luminescent sheet, comprising:
exposing photoluminescent nanofibers in the luminescent sheet to actinic radiation; and thereby
increasing the quantum emission efficiency of the luminescent sheet.

54. The method of claim 53, wherein exposing comprises:
exposing the photoluminescent nanofibers in the luminescent sheet to radiation from 350-490 nm at an optical power of 0.5 $\mu W/cm^2$ or higher.

55. The method of claim 53, wherein exposing comprises:
exposing the photoluminescent nanofibers in the luminescent sheet for a period between 1 and 48 hours.

56. The method of claim 53, wherein further comprising:
prior to exposing, at least one of dip coating, drop coating, spray coating, ink-jet printing, screen printing, or spin coating photoluminescent particles onto the luminescent sheet; and
drying the luminescent sheet.

\* \* \* \* \*